US009614069B1

(12) United States Patent
Lu et al.

(10) Patent No.: US 9,614,069 B1
(45) Date of Patent: *Apr. 4, 2017

(54) III-NITRIDE SEMICONDUCTORS WITH RECESS REGIONS AND METHODS OF MANUFACTURE

(71) Applicant: Cambridge Electronics, Inc., Cambridge, MA (US)

(72) Inventors: Bin Lu, Watertown, MA (US); Ling Xia, Belmont, MA (US)

(73) Assignee: Cambridge Electronics, Inc., Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/376,826

(22) Filed: Dec. 13, 2016

Related U.S. Application Data

(63) Continuation-in-part of application No. 15/234,405, filed on Aug. 11, 2016, now Pat. No. 9,536,984.

(Continued)

(51) Int. Cl.
*H01L 21/336* (2006.01)
*H01L 27/088* (2006.01)
(Continued)

(52) U.S. Cl.
CPC ...... *H01L 29/7784* (2013.01); *H01L 29/2003* (2013.01); *H01L 29/205* (2013.01); *H01L 29/66462* (2013.01)

(58) Field of Classification Search
CPC ............. H01L 29/66734; H01L 29/66704
(Continued)

(56) References Cited

U.S. PATENT DOCUMENTS 6,849,882 B2   2/2005   Chavarkar et al.
7,183,149 B2   2/2007   Ahn et al.
(Continued)

FOREIGN PATENT DOCUMENTS

WO    WO2014078699 A1    5/2014

OTHER PUBLICATIONS

Chu, Rongming, et al. "V-Gate GaN HEMTs With Engineered Buffer for Normally Off Operation," IEEE Electron Device Letters, vol. 29, No. 11, pp. 1184-1186, Nov. 2008, IEEE, US.

(Continued)

*Primary Examiner* — Calvin Lee
(74) *Attorney, Agent, or Firm* — American Patent Agency PC; Daniar Hussain; Xiaomeng Shi

(57) ABSTRACT

A multi-layer semiconductor structure is disclosed for use in III-Nitride semiconductor devices, including a channel layer comprising a first III-Nitride material, a barrier layer comprising a second III-Nitride material, a pair of ohmic electrodes disposed in ohmic recesses etched into the barrier layer, a gate electrode disposed in a gate recess etched into the barrier layer, and a filler element. The gate electrode is stepped to form a bottom stem and at least one bottom step within the gate recess. The filler element, comprising an insulating material, is disposed at least below the bottom step of the gate electrode within the gate recess. Also described are methods for fabricating such semiconductor structures. The performance of resulting devices is improved, while providing design flexibility to reduce production cost and circuit footprint.

20 Claims, 10 Drawing Sheets

Related U.S. Application Data which is a continuation-in-part of application No. 15/094,985, filed on Apr. 8, 2016, now Pat. No. 9,502,535.

(60) Provisional application No. 62/298,824, filed on Feb. 23, 2016, provisional application No. 62/203,438, filed on Aug. 11, 2015, provisional application No. 62/146,055, filed on Apr. 10, 2015.

(51) Int. Cl.
  *H01L 29/778* (2006.01)
  *H01L 29/20* (2006.01)
  *H01L 29/205* (2006.01)
  *H01L 29/66* (2006.01)

(58) Field of Classification Search
  USPC ............ 438/217, 289, 586–590, 604, 653; 257/330–332, 393
  See application file for complete search history.

(56) References Cited

U.S. PATENT DOCUMENTS

| | | | |
|---|---|---|---|
| 7,183,592 B2* | 2/2007 | Hwang | H01L 27/095 257/194 |
| 7,321,132 B2 | 1/2008 | Robinson et al. | |
| 7,449,728 B2 | 11/2008 | Wohlmuth | |
| 7,626,218 B2 | 12/2009 | Hwang et al. | |
| 8,759,876 B2 | 6/2014 | Lu et al. | |
| 9,502,535 B2* | 11/2016 | Xia | H01L 29/4236 438/289 |
| 2007/0018199 A1 | 1/2007 | Sheppard et al. | |
| 2009/0267078 A1 | 10/2009 | Mishra et al. | |
| 2010/0264461 A1 | 10/2010 | Rajan et al. | |
| 2012/0056191 A1 | 3/2012 | Endo et al. | |
| 2014/0264380 A1 | 9/2014 | Kub et al. | |

OTHER PUBLICATIONS

Tang, Yong, et al. "High-Performance Monolithically-Integrated E/D mode InAlN/AlN/GaN HEMTs for Mixed-Signal Applications," Electron Devices Meeting (IEDM), 2010 IEEE International, pp. 30-34, IEEE, US.

Chiu, Hsien-Chin, et al. "Enhancement-and Depletion-Mode InGaP/InGaAs PHEMTs on 6-inch GaAs Substrate," Microwave Conference Proceedings, Asia-Pacific Microwave Conference (APMC) 2005, vol. 2, IEEE, US.

Brown, D. F., et al. "Monolithic Integration of Enhancement-and Depletion-Mode AlN/GaN/AlGaN DHFETs by Selective MBE Regrowth," IEEE Transactions on Electron Devices, vol. 58, No. 4, pp. 1063-1067, Apr. 2011, IEEE, US.

Ota, K., et al. "A Normally-Off GaN FET with High Threshold Voltage Uniformity Using a Novel Piezo Neutralization Technique," 2009 IEEE International Electron Devices Meeting (IEDM), pp. 1-4, IEEE, US.

Chu, R., et al. "AlGaN-GaN Double-Channel HEMTs," IEEE Transactions on Electron Devices, vol. 52, No. 4, pp. 138-446, Apr. 2005, IEEE, US.

Therrien, R., et al, "A 36mm GaN-on-Si HFET Producing 368W at 60V with 70% Drain Efficiency," 2005 IEEE International Electron Devices Meeting (IEDM), IEEE, US.

Yoshida, S,. et al, "A 76 GHz GaN-on-Silicon Power Amplifier for Automotive Radar Systems," Microwave Symposium Digest, 2009. MTT'09. IEEE MTT-S International, pp. 665-668, IEEE, 2009.

* cited by examiner

III-NITRIDE SEMICONDUCTORS WITH RECESS REGIONS AND METHODS OF MANUFACTURE

REFERENCE TO RELATED APPLICATIONS

This application is a non-provisional of and claims the benefit of priority to U.S. Ser. No. 62/298,824, filed on 23 Feb. 2016, entitled "III-Nitride Semiconductors with Recess Regions."

This application is also a Continuation-in-Part (CIP) of and claims the benefit of priority to U.S. Ser. No. 15/234,405, filed on 11 Aug. 2016, entitled "Semiconductor Structure with a Spacer Layer," issued as U.S. Pat. No. 9,826,984, on Jan. 3, 2017, which itself is a non-provisional of and claims the benefit of priority to U.S. Ser. No. 62/203,438, filed on 11 Aug. 2015, entitled "Novel III-Nitride Structure with Spacer Layer," and is also a Continuation-in-Part (CIP) of and claims the benefit of priority to U.S. Ser. No. 15/094,985, filed on 8 Apr. 2016, entitled "Semiconductor Structure and Etch Technique for Monolithic Integration of III-N Transistors," issued as U.S. Pat. No. 9,502,535, on Nov. 22, 2016, which itself is a non-provisional of and claims the benefit of priority to U.S. Ser. No. 62/146,055, filed on 10 Apr. 2015, entitled "III-Nitride Integration Technology." The entire disclosures of all cited applications are hereby incorporated by reference in their entireties herein.

FIELD OF THE INVENTION

Described herein are semiconductor structures, and processes for forming semiconductor structures. Etching techniques are described for forming recesses in a semiconductor structure, such as gate recesses and/or ohmic recesses. Such structures and techniques can be used to produce high performance transistors for various uses such as in power electronics, power amplification and digital electronics.

BACKGROUND OF THE INVENTION

The statements in this section may serve as a background to help understand the invention and its application and uses, but may not constitute prior art.

Compared with conventional power devices made of silicon, Group III-Nitride (III-N) semiconductors possess a number of excellent electronic properties that enable the fabrication of modern power electronic devices and structures for use in a variety of applications. Silicon's limited critical electric field and relatively high resistance make currently available commercial power devices, circuits, and systems bulky, heavy, with further constraints on operating frequencies. On the other hand, higher critical electric field and higher electron density and mobility of III-N materials allow high-current, high-voltage, high-power and/or high-frequency performances of improved power transistors that are greatly desirable for advanced transportation systems, high-efficiency electricity generation and conversion systems, and energy delivery networks. Such systems rely on efficient converters to step-up or step-down electric voltages, and use power transistors capable of blocking large voltages and/or carrying large currents. For example, power transistors with blocking voltages of more than 500V are used in hybrid vehicles to convert DC power from the batteries to AC power. Some other exemplary applications of power transistors include power supplies, automotive electronics, automated factory equipment, motor controls, traction motor drives, high voltage direct current (HVDC) electronics, lamp ballasts, telecommunication circuits and display drives.

In spite of the enormous potential of III-N semiconductor devices for producing high-efficiency power electronics such as high power amplifiers and converters, a major factor that limit the performance and reliability of III-N high electron mobility transistors for high power and high frequency applications is high gate leakage current due to significant amount of surface defects and electron traps by surface or bulk trap states. In a conventional III-N transistor, a Schottky gate biased with a positive voltage during operation can have a gate leakage current as high as the drain current, leading to malfunction of the device. Gate leakage degradation at high electric fields are also commonly observed. Recently, gate leakage current and channel electric field management structures such as gate recesses, T-shaped and Γ-shaped gates, field-plates, and suitable passivation materials have been proposed and studied, some of which provide noticeable performance improvements. Nonetheless, further and significant reduction of gate leakage current are highly desirable for achieving high levels of reliability and stability under high-performance operations.

Therefore, in view of the aforementioned practicalities and difficulties, there is an unsolved need for Group III-Nitride semiconductor structures, and for reducing device failure mechanisms, preventing high gate leakage currents, increasing breakdown voltages, and generally improving the reliability and stability of semiconductor devices fabricated thereon.

BRIEF SUMMARY OF THE INVENTION

The present invention provides semiconductor structures and methods for fabricating III-nitride transistors with recessed regions.

In one aspect, one embodiment of the present invention is a multi-layer semiconductor structure for use in a III-Nitride (III-N) semiconductor device, comprising a channel layer, a barrier layer, a pair of ohmic electrodes, a gate electrode, and a first filler element. The channel layer comprises a first III-N material for providing electrical conduction. The barrier layer comprises a second III-N material. The pair of ohmic electrodes is disposed in ohmic recesses etched into the barrier layer, and the gate electrode is disposed in a gate recess etched into the barrier layer, in-between the pair of ohmic electrodes. The gate electrode is stepped to form a bottom stem and a bottom step within the gate recess. The first filler element is disposed at least below the bottom step of the gate electrode within the gate recess, and the first filler element comprises a first insulating material.

In some embodiments of the present invention, the multi-layer semiconductor structure further comprises a second filler element disposed between the gate electrode and a sidewall of the gate recess, where the second filler element comprises a second insulating material, where the second filler element covers at least a portion of the sidewall of the gate recess, and where the second filler element is in contact with the first filler element. In some embodiments, the multi-layer semiconductor structure further comprises an air gap between a sidewall of the gate electrode and the second filler element.

In some embodiments of the present invention, a top portion of the gate electrode exceeding a top level of the gate recess is shorter in length than the gate recess.

In some embodiments of the present invention, the multi-layer semiconductor structure further comprises a gate dielectric layer disposed over the gate recess, above the first filler element and below the gate electrode within the gate recess.

In some embodiments of the present invention, the barrier layer comprises a band-offset layer disposed above the channel layer, where the band-offset layer comprises a third III-N material, and where the band-offset layer has a wider bandgap than the channel layer. In some embodiments, the multi-layer semiconductor structure further comprises a passivation layer disposed on the barrier layer, where the gate recess is etched through the passivation layer. In some embodiments, the barrier comprises a sublayer that is n-type doped.

In some embodiments of the present invention, the barrier layer comprises a spacer layer comprising a third III-N material, and a cap layer disposed on the spacer layer, the cap layer comprising at least two sublayers. Each sublayer is selectively etchable with respect to sublayers immediately below and above, each sublayer comprises a III-N material $Al_xIn_yGa_zN$ in which $0 \le x \le 1$, $0 \le y \le 1$, and $0 \le z \le 1$, and at least one of the sublayers has a non-zero Ga content with $0 < z \le 1$. In addition, a sublayer immediately above the spacer layer has a wider bandgap than the spacer layer, and a bottom of the gate recess is within or on a layer selected from the group consisting of the channel layer, the spacer layer, and one of the sublayers of the cap layer.

In some embodiments of the present invention, the barrier layer comprises a bottom sublayer, a middle sublayer, and a top sublayer, where each sublayer comprises a III-N material $Al_xIn_yGa_zN$ in which $0 \le x \le 1$, $0 \le y \le 1$, and $0 \le z \le 1$. Moreover, the bottom sublayer has a bandgap equal to or greater than that of the channel layer, the middle sublayer has a bandgap equal to or greater than that of the bottom sublayer, the top sublayer has a bandgap equal to or smaller than that of the middle sublayer, and a bottom of the gate recess is within or on a layer selected from the group consisting of the channel layer, and one of the sublayers of the barrier layer.

In yet some embodiments of the present invention, the multi-layer semiconductor structure further comprises a back barrier layer disposed below the channel layer, where the back barrier layer comprises a III-N material $Al_xIn_yGa_zN$ in which $0 \le x \le 1$, $0 \le y \le 1$, and $0 \le z \le 1$, and where the back barrier layer has a wider bandgap and/or an opposite polarization direction than the channel layer.

In another aspect, one embodiment of the present invention is a method of fabricating a multi-layer semiconductor structure for use in a III-Nitride (III-N) semiconductor device. The method comprising steps of forming a channel layer comprising a first III-N material for providing electrical conduction; forming a barrier layer comprising a second III-N material; forming a pair of ohmic recesses by patterning and etching of the barrier layer; depositing a pair of ohmic electrodes in the pair of ohmic recesses respectively; forming a gate recess by patterning and etching of the barrier layer, where the gate recess is positioned in-between the pair of ohmic recesses; depositing a first filler layer covering a bottom of the gate recess, where the first filler layer comprises a first insulating material; recessing a recess through the filler layer, where a length of the recess through the filler layer is smaller than that of the gate recess, to form a first filler element at the bottom of the gate recess; and depositing a gate electrode in the gate recess, where the gate electrode is stepped by the first filler element to form a bottom stem and a bottom step within the gate recess.

In some embodiments of the present invention, the method further comprises depositing a second filler element between the gate electrode and a sidewall of the gate recess, where the second filler element comprises a second insulating material, where the second filler element covers at least a portion of the sidewall of the gate recess, and where the second filler element is in contact with the first filler element. In some embodiments, a sidewall of the gate electrode is insulated by an air gap between the sidewall of the gate electrode and the second filler element.

In some embodiments of the present invention, a top portion of the gate electrode exceeding a top level of the gate recess thus formed is shorter in length than the gate recess.

In some embodiments of the present invention, the method further comprises depositing a gate dielectric layer over the gate recess, above the first filler element and below the gate electrode within the gate recess.

In some embodiments of the present invention, the barrier layer comprises a band-offset layer formed above the channel layer, where the band-offset layer comprises a third III-N material, and where the band-offset layer has a wider bandgap than the channel layer.

In some embodiments of the present invention, the barrier layer thus formed comprises a spacer layer comprising a third III-N material, and a cap layer disposed on the spacer layer, the cap layer comprising at least two sublayers. Each sublayer is selectively etchable with respect to sublayers immediately below and above, each sublayer comprises a III-N material $Al_xIn_yGa_zN$ in which $0 \le x \le 1$, $0 \le y \le 1$, and $0 \le z \le 1$, and at least one of the sublayers has a non-zero Ga content with $0 < z \le 1$. In addition, a sublayer immediately above the spacer layer has a wider bandgap than the spacer layer, and a bottom of the gate recess is within or on a layer selected from the group consisting of the channel layer, the spacer layer, and one of the sublayers of the cap layer.

In some embodiments of the present invention, the barrier layer thus formed comprises a bottom sublayer, a middle sublayer, and a top sublayer, where each sublayer comprises a III-N material $Al_xIn_yGa_zN$ in which $0 \le x \le 1$, $0 \le y \le 1$, and $0 \le z \le 1$. Moreover, the bottom sublayer has a bandgap equal to or greater than that of the channel layer, the middle sublayer has a bandgap equal to or greater than that of the bottom sublayer, the top sublayer has a bandgap equal to or smaller than that of the middle sublayer, and a bottom of the gate recess is within or on a layer selected from the group consisting of the channel layer, and one of the sublayers of the barrier layer.

In some embodiments of the present invention, the method further comprises depositing a back barrier layer below the channel layer, where the back barrier layer comprises a III-N material $Al_xIn_yGa_zN$ in which $0 \le x \le 1$, $0 \le y \le 1$, and $0 \le z \le 1$, and where the back barrier layer has a wider bandgap and/or an opposite polarization direction than the channel layer.

Yet other aspects of the present invention include the semiconductor structures, processes and methods comprising the steps described herein, and also include the processes and modes of operation of the devices described herein. Other aspects and embodiments of the present invention will become apparent from the detailed description of the invention when read in conjunction with the attached drawings.

The foregoing summary is provided by way of illustration and is not intended to be limiting.

BRIEF DESCRIPTION OF DRAWINGS

Embodiments of the present invention described herein are exemplary, and not restrictive. Embodiments will now be described, by way of examples, with reference to the accompanying drawings. In these drawings, each identical or nearly identical component that is illustrated in various figures is represented by a like reference character. For purposes of clarity, not every component is labeled in every drawing. The drawings are not necessarily drawn to scale, with emphasis instead being placed on illustrating various aspects of the techniques and devices described herein.

DETAILED DESCRIPTION OF THE INVENTION

Figure 1:
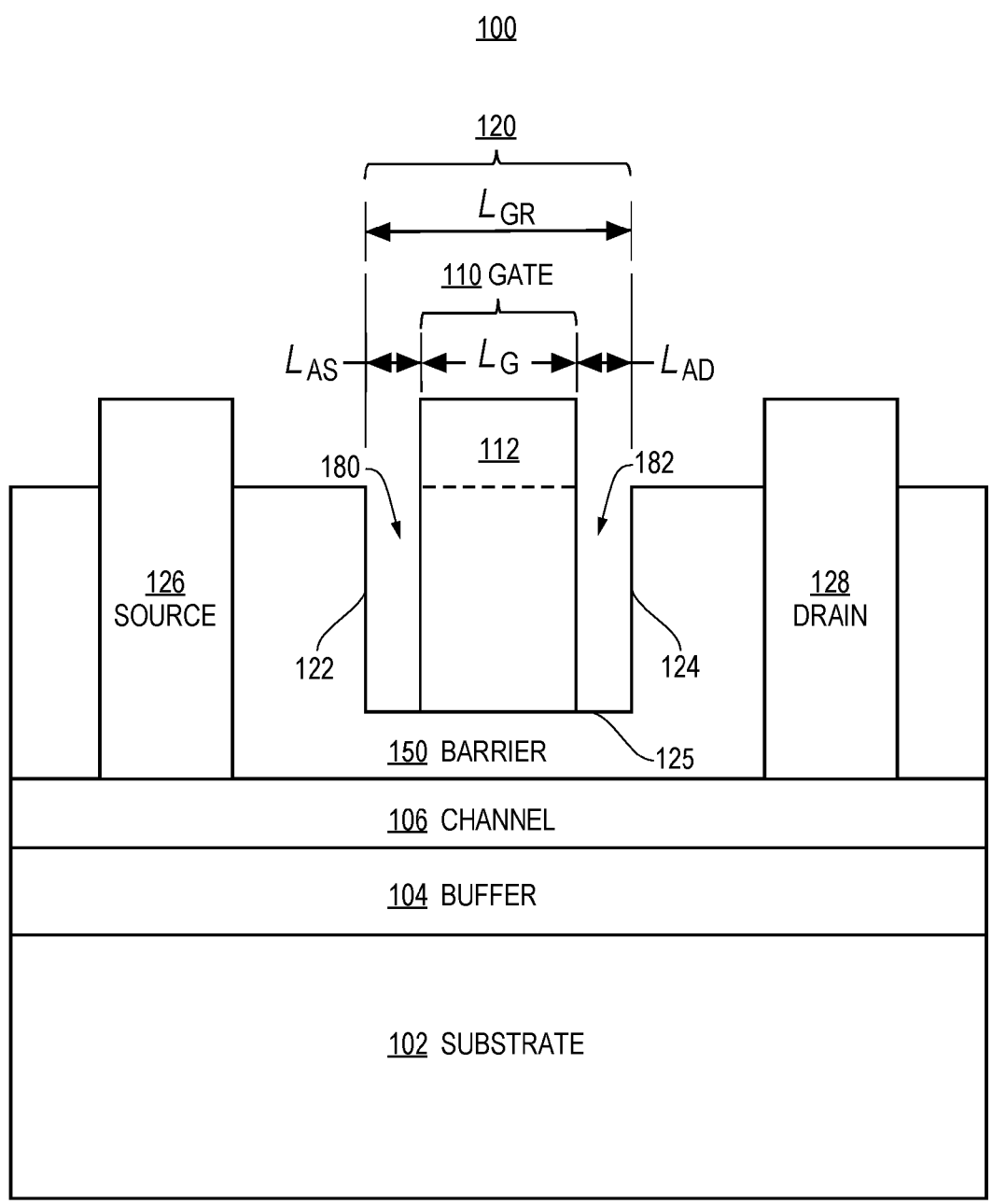
FIGS. 1, 2 and 3 show exemplary semiconductor structures each containing a recessed-gate transistor, according to several embodiments of the present invention, respectively.

In the following description, for purposes of explanation, numerous specific details are set forth in order to provide a thorough understanding of the invention. It will be apparent, however, to one skilled in the art that the invention can be practiced without these specific details. In other instances, structures, devices, activities, and methods are shown using schematics, use cases, and/or flow diagrams in order to avoid obscuring the invention. Although the following description contains many specifics for the purposes of illustration, anyone skilled in the art will appreciate that many variations and/or alterations to suggested details are within the scope of the present invention. Similarly, although many of the features of the present invention are described in terms of each other, or in conjunction with each other, one skilled in the art will appreciate that many of these features can be provided independently of other features. Accordingly, this description of the invention is set forth without any loss of generality to, and without imposing limitations upon, the invention.

Broadly, embodiments of the present invention relate to multi-layer semiconductor structures and methods for fabricating such structures, with recessed gate regions and/or ohmic regions. Such multi-layer structures with recess regions may facilitate the monolithic integration of Group III-Nitride (III-N) transistors having different threshold voltages, while minimizing gate leakage current through the barrier layer, either below the gate region, through sidewalls of the gate recess, or at gate edges. The semiconductor structures described herein may be formed of compound semiconductor materials, such as III-V semiconductor materials, particularly Group III-Nitride (III-N) semiconductor materials.

The threshold voltage of a transistor is a gate voltage past which the transistor is turned from an on-state to an off-state, or vice versa. Gate and/or ohmic recesses formed with specific, controllable depths can lead to desired or targeted threshold voltages, thus enabling the production of normally-off field effect transistors, and the integration of Enhancement-mode (E-mode) and Depletion-mode (D-mode) transistors on a common substrate. In addition, gate recesses have been used in nitride semiconductor-based high-electron-mobility transistors (HEMTs) to reduce short channel effects, improve current gain cut-off frequency, and improve device performance in various manners. Nonetheless, the recessing process may induce surface damages and cause etch-based variations that significantly contribute to increased gate leakage current, thus comprising device characteristics, reliability, and stability.

Described herein are semiconductor structures and processes for forming semiconductor structures to precisely control etching depth, produce low defect density on recessed surfaces, and significantly reduce gate leakage current by the use of insulating filler elements and air gaps within gate recesses. In particular, some embodiments of the present invention modify a gate edge profile within a gate recess by stepping the bottom of a gate electrode using at least one filler element during the fabrication process, and by further shielding or insulating the recessed and stepped gate electrode from enclosing semiconductor materials using additional filler elements and/or air gaps that partially or fully cover the gate electrode within the gate recess.

Further described herein are multi-layer semiconductor structures and techniques that exploit etching selectivity between different III-N semiconductor materials. For example, GaN can be selectively etched over materials such as AlN, AlGaN, InAlN and AlInGaN with high Al content using a dry etching technique. More generally, iterations between a selective dry etching step and a selective or non-selective wet etching step may be used to achieve precise control of recess depth and to produce a surface with a low density of defect states.

With reference to the figures, embodiments of the present invention are now described in detail.

Figure 2:
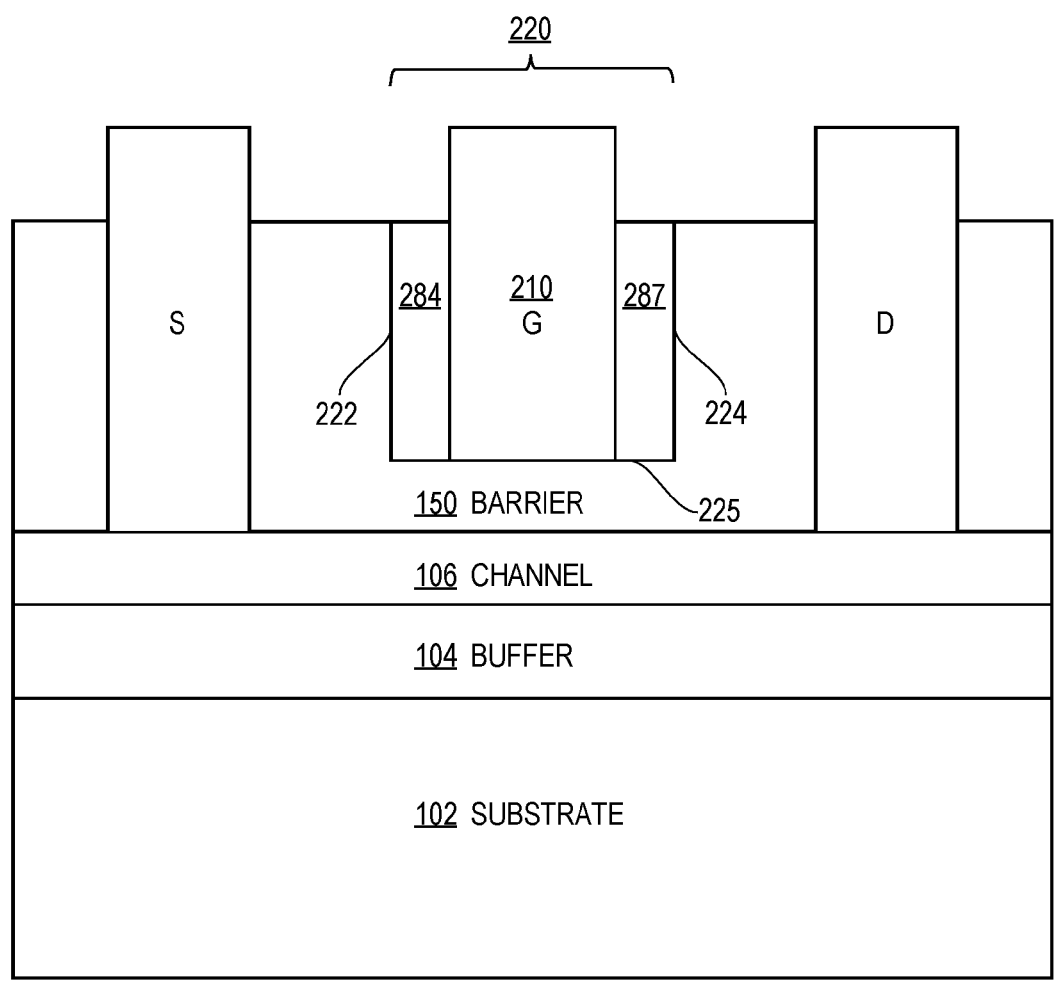
Figure 3:
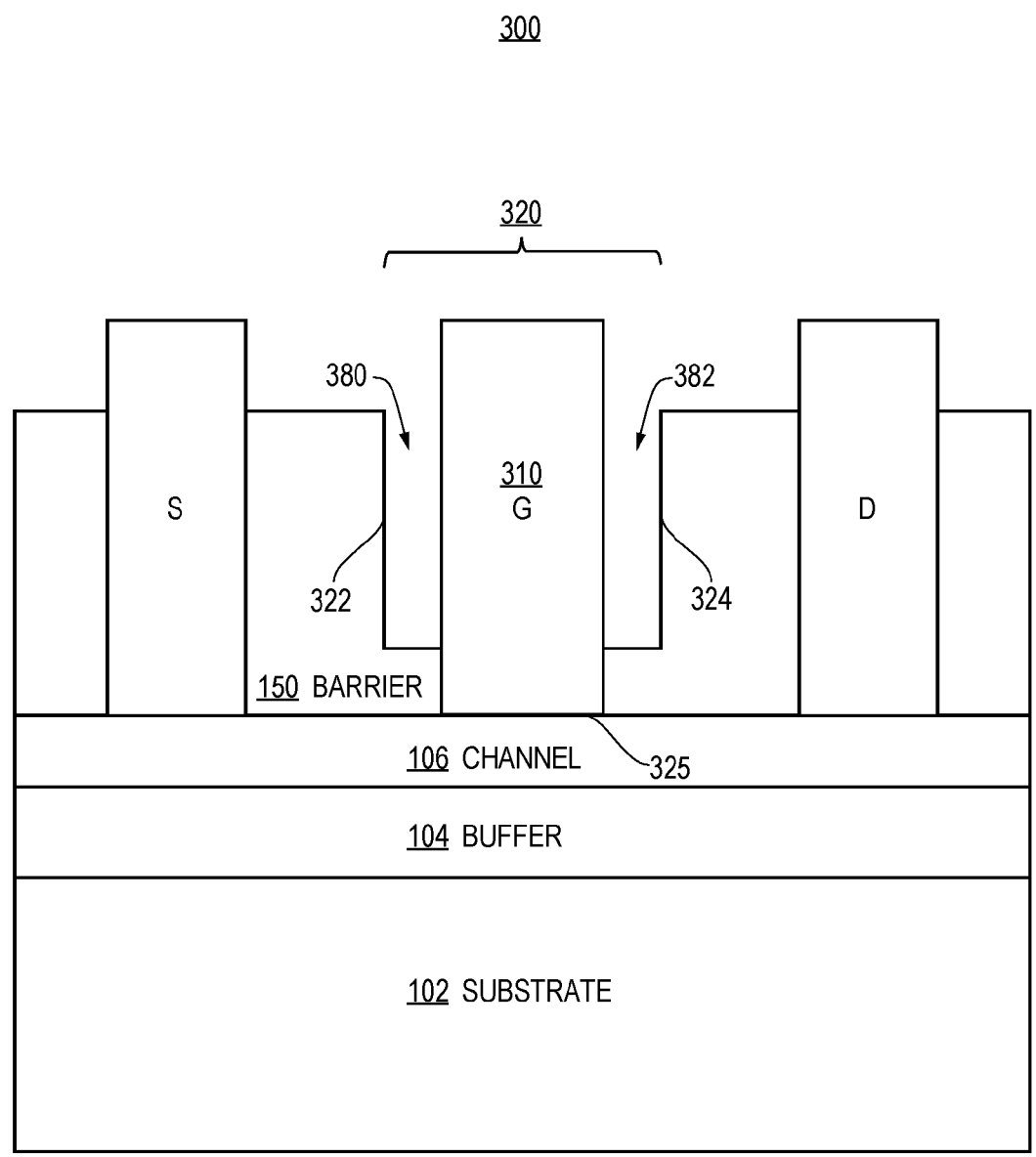

FIG. 1 shows a cross-section view of an exemplary semiconductor structure 100 containing a recessed-gate transistor with a gate electrode or gate contact 110 insulated from sidewalls 122 and 124 of a gate recess 120 by air gaps 180 and 182, according to one embodiment of the present invention. Similarly, FIG. 2 shows an exemplary semiconductor structure 200 containing a recessed-gate transistor with a gate contact 210 insulated from sidewalls 222 and 224 of a gate recess 220 by filler elements 284 and 287, according to one embodiment of the present invention. FIG. 3, on the other hand, shows an exemplary semiconductor structure 300 containing a recessed-gate transistor with a gate contact 310 insulated from sidewalls 322 and 324 of a gate recess 320 by air gaps 380 and 382, according to another embodiment of the present invention. In the present disclosure, terms "electrode" and "contact" are used interchangeably.

Each of semiconductor structures 100, 200, and 300 may include a substrate 102, a buffer layer 104, a channel layer 106, and a barrier layer 150. In some embodiments, each layer may have a thickness of at least 0.2 nanometers (nm), and channel layer 106 may have a thickness between 1 nm and 10,000 nm or 10 μm. In some embodiments, each layer may have a thickness between 0.5 nm and 40 nm. In some embodiments, barrier layer 150 may include two or more sublayers, where each sublayer may be etchable by different etching techniques, where some sublayers may serve as etch stops to sublayers immediately above, and where each sublayer may possess bandgap properties the help improve threshold voltages when used in a field-effect transistor.

In semiconductor structures 100 shown in FIG. 1, gate recess 120 is etched into barrier layer 150, where a bottom 125 of gate recess 120 is positioned within barrier layer 150. In some embodiments, thickness of the semiconductor material between the gate recess and channel layer 106 is between 0.5 nm and 40 nm. In some embodiments, thickness of the semiconductor material between the gate recess and channel layer 106 is within 10 nm. Gate electrode 110 is disposed in gate recess 120, in-between source ohmic electrode 126 and drain ohmic electrode 128, each disposed in ohmic recesses etched into barrier layer 150. Air gaps 180 and 182 insulate sidewalls of gate electrode 110 from barrier layer 150, thus reducing gate leakage through the sidewalls of the gate recess, and help increase device breakdown voltage. In this example, the lateral lengths or "thickness" of air gaps 180 and 182 may determine the amount of achievable reduction in gate leakage. In various embodiments, air gaps 180 and 182 may have the same or different lateral lengths $L_{AS}$ and $L_{AD}$, where each may be less than one tenth of gate length $L_G$, may be between one tenth and one third of gate length $L_G$ or may be between one third and one half of gate length $L_G$. In some embodiments, a top portion 112 of gate electrode 110, exceeding a top level of gate recess 120, may be no greater in length than gate recess 120, where the length of gate recess 120 is represented by $L_{GR}$, as indicated in the cross-section view shown in FIG. 1. In this particular example, both gate electrode 110 and gate recess 120 are shown to be rectangular in cross section, and uniform in lateral length. In embodiments where either gate electrode 110 or gate recess 120 is further recessed, stepped, or otherwise modified to be nonuniform in shape, gate length $L_G$ may be measured as the largest lateral distance between two sidewalls of gate electrode 110, while gate recess length $L_{GR}$ may be measured as the largest lateral distance between two sidewalls of gate recess 120.

In semiconductor structure 200 shown in FIG. 2, gate recess 220 is etched into barrier layer 150, where a bottom 225 of gate recess 220 is positioned within barrier layer 150. Gate contact 210 is disposed in gate recess 220, which in turn is positioned in-between ohmic recesses etched into barrier layer 150. Filler elements 284 and 287 are disposed between sidewalls of gate contact 210 and sidewalls 222 and 224 of gate recess 220, respectively. In this example, each filler element covers a sidewall of gate recess 220. In some embodiments, a filler element may partially fill the space between gate contact 210 and a sidewall of gate recess 220, towards the bottom, such that an air gap exists above the filler elements within gate recess 220. In some embodiments, each filler element may comprise more than one insulating material. In some embodiments, each filler element may comprise one or more components, where each component is made of one or more insulating materials.

In semiconductor structure 300 shown in FIG. 3, gate recess 320 is etched into barrier layer 150, and a lower portion of gate recess 320 is stepped, so a bottom 325 of gate recess 320 is on channel layer 106. Gate contact 310 is disposed in gate recess 320 and through the lower stepped portion. In this example, air gaps 380 and 382 located between gate contact 310 and sidewalls 322 and 324 of gate recess 320 partially insulate gate contact 310 from barrier layer 150.

Although pairs of air gaps are shown in FIG. 1 and FIG. 3, and a pair of filler elements is shown in FIG. 2, in some other embodiments not shown explicated herein, a single air gap or a single filler element may be present, between the gate contact and the sidewall towards the drain ohmic contact, to reduce gate-drain leakage current.

Examples of materials that may form the semiconductor structure 100 will now be described.

In some embodiments, a semiconductor material with a lattice constant different from that of substrate 102 may be formed over substrate 102, where substrate 102 is suitable for III-Nitride semiconductor epitaxial growth. In some embodiments, buffer layer 104 may be included between substrate 102 and the overlying semiconductor material to accommodate a difference in lattice constant. Substrate 102 may include a group IV, III-V, or II-VI semiconductor material such as silicon, germanium, or ZnO for example. Other typical substrates include SiC, Sapphire, Si, and bulk GaN. The semiconductor material formed over substrate 102 may include a compound semiconductor material, such as a III-V semiconductor material (e.g., a III-N material). Suitable techniques for accommodating a lattice mismatch between substrate 102 and a semiconductor material of a different lattice constant using a buffer layer 104 are understood by those of ordinary skill in the art, and will not be detailed herein. In some embodiments, a substrate 102 having a suitable lattice constant for the formation of overlying compound semiconductor material(s) may be used, and buffer layer 104 may be omitted. For example, substrate 102 may be a GaN substrate, a ZnO substrate or another substrate of a material with a lattice constant similar to that of a compound semiconductor material to be formed thereon. The techniques described herein are not limited as to substrate 102 or buffer layer 104. In addition, although not shown explicitly in FIG. 1, in some embodiments, a nucleation layer may be disposed between substrate 102 and buffer layer 104; in some other embodiments, buffer layer 104 may include the nucleation layer or a nucleation region at the interface with substrate 102.

Substrate 102 and the layers of semiconductor materials formed thereon may be monocrystalline, and may have any suitable crystallographic orientation. Compound semiconductor materials, if included in substrate 102 or an overlying layer, may have any suitable composition at the face of the semiconductor material. If a III-N material is included, it may have an N-face composition or a group III face composition. For example, GaN may be grown either N-face/N-polar, Ga-face/Ga-polar or in non-polar orientations.

Channel layer 106 may be formed of a semiconductor material suitable for formation of a channel therein, to provide electrical conduction. In some embodiments, channel layer 106 may include a III-V semiconductor material, such as a III-N semiconductor material. In some embodiments, channel layer 106 may include gallium nitride (GaN). In some embodiments, a nitride semiconductor material may be used such as $B_w Al_x In_y Ga_z N$, for example, in which w, x, y and z each has a suitable value between zero and one (inclusive), and $w+x+y+z=1$. Exemplary materials for the formation of channel layer 106 include, but are not limited to, GaN, InN, AlGaN, AlInN, InGaN, and AlInGaN.

In some embodiments, a semiconductor heterostructure may be formed in the semiconductor structure 100. For example, in some embodiments a barrier layer 150 comprising $B_{w1} Al_{x1} In_{y1} Ga_{z1} N$ and a channel layer 106 comprising $B_{w2} Al_{x2} In_{y2} Ga_{z2} N$ may be formed, where a semiconductor material of barrier layer 150 has a larger bandgap and/or polarization than that of channel layer 106. However, the techniques described herein are not limited as to the formation of heterostructures.

As implicitly implied above, in some embodiments, each layer formed over substrate 102, including buffer layer 104, channel layer 106, and barrier layer 150 may comprise more than one materials, including III-N materials. For example, buffer layer 104 may comprise an AlN/GaN superlattice. In some embodiments, a portion or one or more regions of buffer layer 104 or channel 106 may be GaN. Such regions may be located at layer interfaces, or at positions particularly defined with respect to desired gate or ohmic contact regions. For example, the nucleation layer as described before may be included as part of buffer layer 104 at the interface with substrate 102. In yet some other embodiments, one or more layers formed over substrate 2 may be doped with a suitable dopant.

Figure 7:
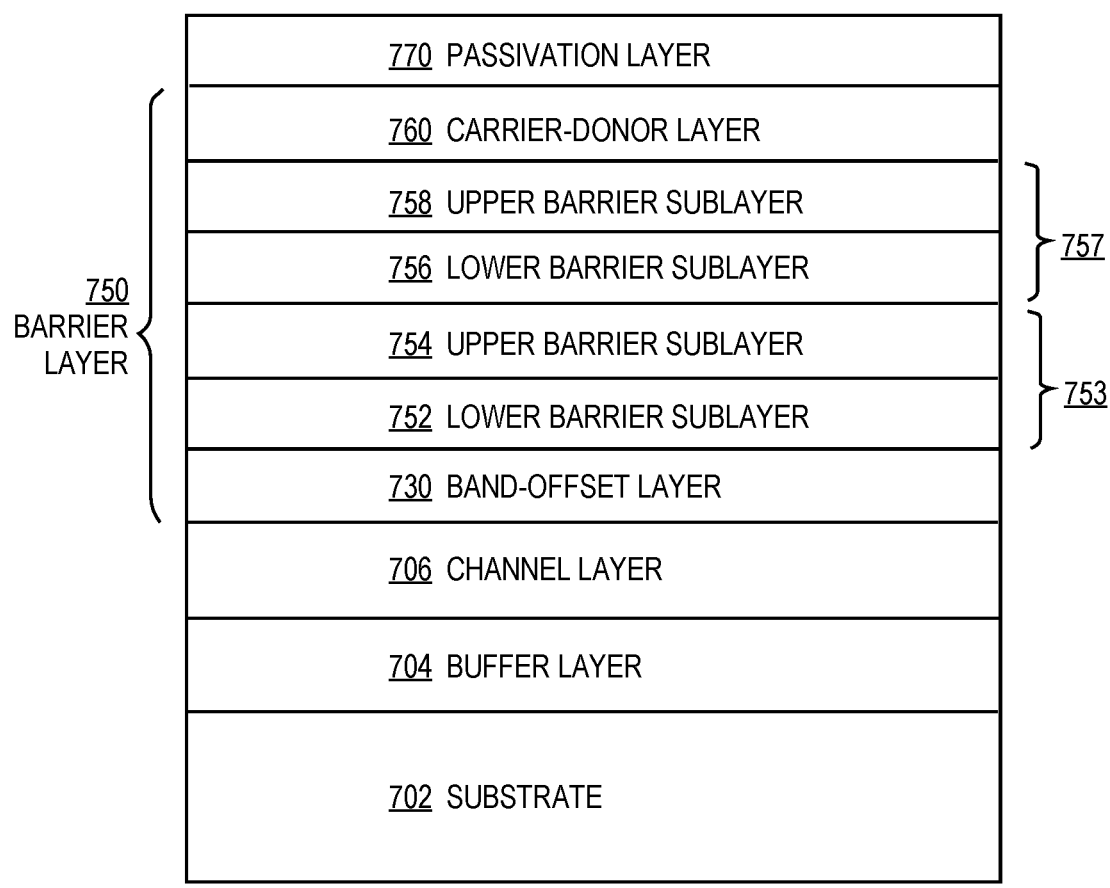
FIG. 7 shows a multi-layer semiconductor structure with a plurality of dual layer barrier structures, according to one embodiment of the present invention.
Figure 8:
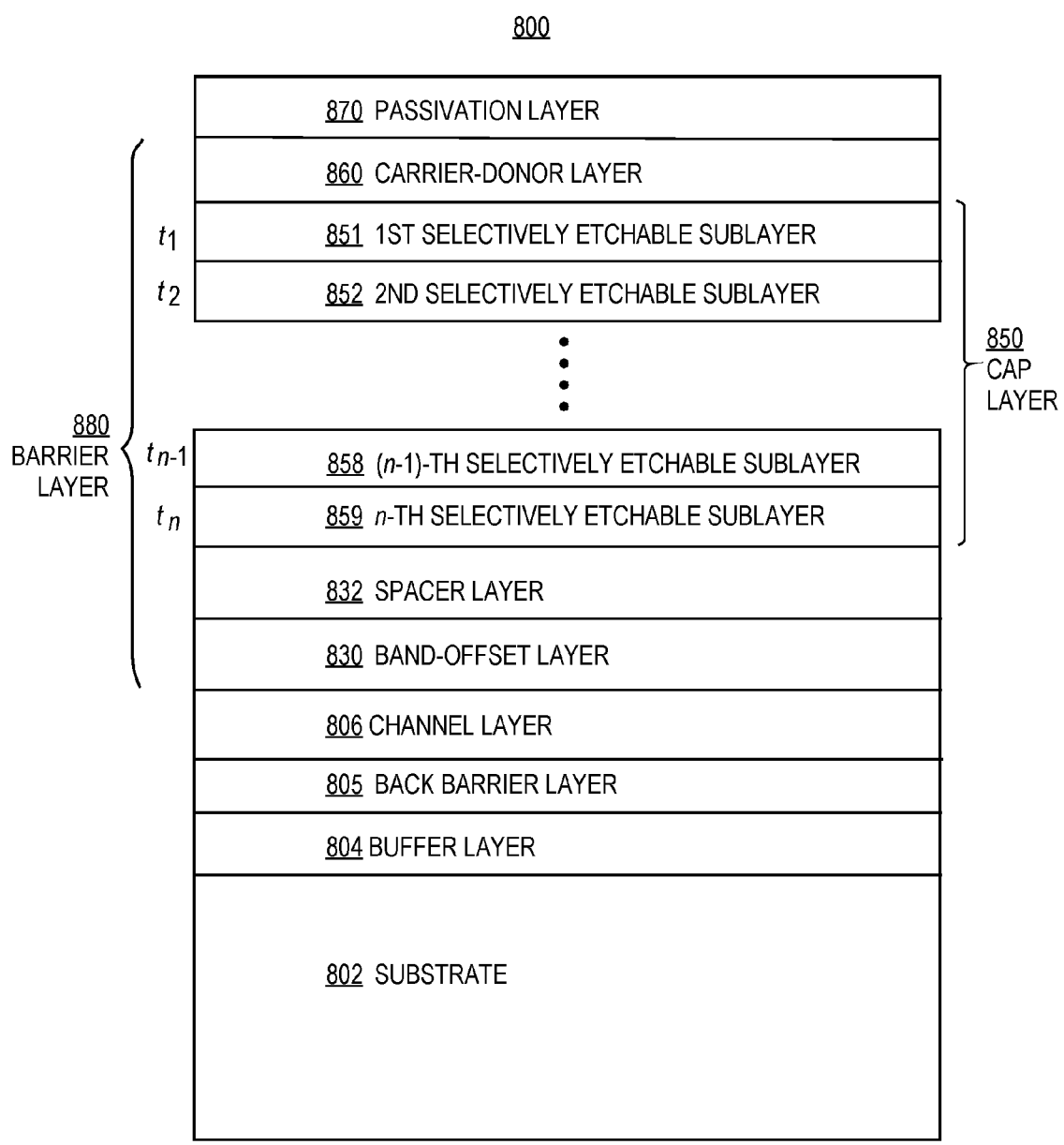
FIG. 8 shows a multi-layer semiconductor structure with a spacer layer and a cap layer comprising multiple selectively etchable sublayers, according to one embodiment of the present invention.

As discussed above, in some embodiments, barrier layer 150 may be formed having two or more layers or sublayers, as shall be discussed further with respect to FIGS. 7 and 8. For example, barrier layer 150 may include one or more "dual-layer" barrier structures each having an upper barrier layer of a first semiconductor material that is etchable using a first etching technique and a lower barrier layer of a second semiconductor material that is etchable using a second etching technique. For example, the upper barrier layer may include a semiconductor material selectively etchable in a dry etching process, such as GaN, or another nitride semiconductor material such as $B_wAl_xIn_yGa_zN$, in which w, x, y and z each has a suitable value between zero and one (inclusive), and w+x+y+z=1, and the composition is such that the nitride semiconductor material is selectively etchable using a dry etching process. As another example, the upper barrier layer may include a semiconductor material such as $B_wAl_xIn_yGa_zN$ in which x is less than 0.25. In yet some other embodiments, barrier layer 150 may comprise an odd number of sublayers.

Any sublayer of barrier layer 150 or barrier layer 150 itself may be doped or undoped. Doping of a sublayer may supply carriers to channel layer 106 underneath. After gate recessing, one or more doped regions may be formed below the gate, between the gate and the source and/or between the gate and the drain, outside of the gate-recess. A doped region may be polarization doped or may include dopants such as n-type dopants or p-type dopants. A doped region may have any suitable doping concentration and distribution. For example, dopants may be provided at the lower surface of barrier 150, the upper surface of barrier layer 150, a lower surface or an upper surface of a sublayer within barrier 150, and/or in another location. The doping profile may be uniform or non-uniform. The doping concentration may be at least $10^{16}$ cm$^{-3}$. In some embodiments, a delta-doping profile may be used. In addition, any suitable doping technique may be used, such as implantation or diffusion. In some embodiments, ay sublayer of barrier layer 150 may be doped during its formation (e.g., growth). In some embodiments, the doping type may be of the same type as that of carriers in the channel region. For example, the doping type may be n-type for an n-channel transistor and p-type for a p-channel transistor. In some embodiments, a doped region may be highly doped.

The reference herein to $B_wAl_xIn_yGa_zN$ or a "$B_wAl_xIn_yGa_zN$ material" refers to a semiconductor material having nitride and one or more of boron, aluminum, indium and gallium. Examples of $B_wAl_xIn_yGa_zN$ materials include binary, ternary, and quaternary compounds such as GaN, AlN, AlGaN, AlInGaN, InGaN, and BAlInGaN, by way of illustration. Examples of $B_wAl_xIn_yGa_zN$ materials also include compounds with relatively percentages in which w, x, y and z each has a suitable value between zero and one (0≤w≤1, 0≤x≤1, 0≤y≤1, and 0≤z≤1), and w+x+y+z=1. A $B_wAl_xIn_yGa_zN$ material may include other materials besides nitride, boron, aluminum, indium and/or gallium as well. For example, a $B_wAl_xIn_yGa_zN$ material may be doped with a suitable dopant such as silicon and germanium. Furthermore, in the present disclosure, the terms "$B_wAl_xIn_yGa_zN$ material" and "III-N material" are used interchangeably to represent nitride-based compound semiconductor materials, unless otherwise specified or limited.

In this particular example shown in FIG. 1, gate contact or gate electrode 110 is placed in the recessed gate region 120, making direct contact to barrier layer 150 at the bottom of the gate recess. Gate contact 110 may be made from materials such as metals, metal compounds, polycrystalline semiconductors, or any other suitable conductive material. Ohmic contacts or electrodes 126 and 128 are placed within ohmic recesses to make direct contact with channel layer 106. Ohmic electrodes 126 and 128 may be made of materials selected from titanium, nickel, tungsten, tantalum, aluminum, gold, molybdenum, any other suitable metal, or a combination of such. Such ohmic electrodes make electrical connection to channel layer 106, so electrical current flows between the ohmic electrodes laterally via the channel layer. Gate electrode 110 controls the current flow in the channel layer 106 underneath the gate recess. Depending on the thickness of the barrier layer below the gate contact, and the gate electrode's work-function, the transistor shown in FIG. 1 may be either a normally-off device having no free electrons in the channel layer underneath the gate region with no gate bias voltage, or a normally-on device having free electrons in the channel layer underneath the gate region with no gate bias voltage. In some embodiments, ohmic electrodes are in contact with at least part of the side-walls of the ohmic recesses. In addition, the depth of ohmic recesses may be the same as that of the gate recess, deeper than that of the gate recess, as shown in FIG. 1, or shallower than that of the gate recess. The ohmic recess depth for source 126 and drain 128 may be the same or different.

A process of forming a transistor in the semiconductor structures 100, 200, or 300 shown in FIGS. 1, 2, 3, using two or more etching steps is discussed in parent application Ser. No. 15/234,405, the entire disclosure of which is hereby incorporated by reference in its entirety herein.

Figure 4:
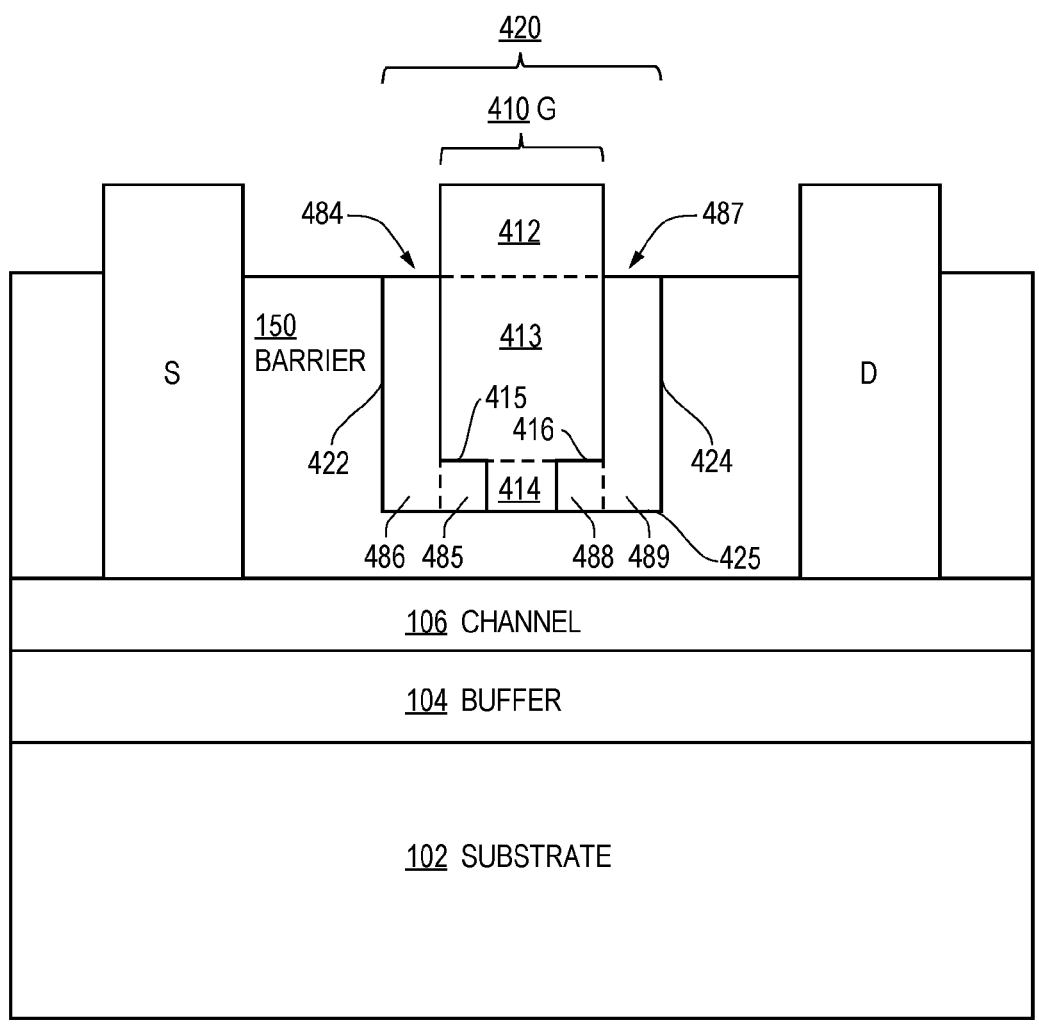
FIGS. 4, 5, and 6 show exemplary semiconductor structures each containing a recessed-gate transistor with a gate electrode stepped on the bottom, according to several embodiments of the present invention, respectively.
Figure 5:
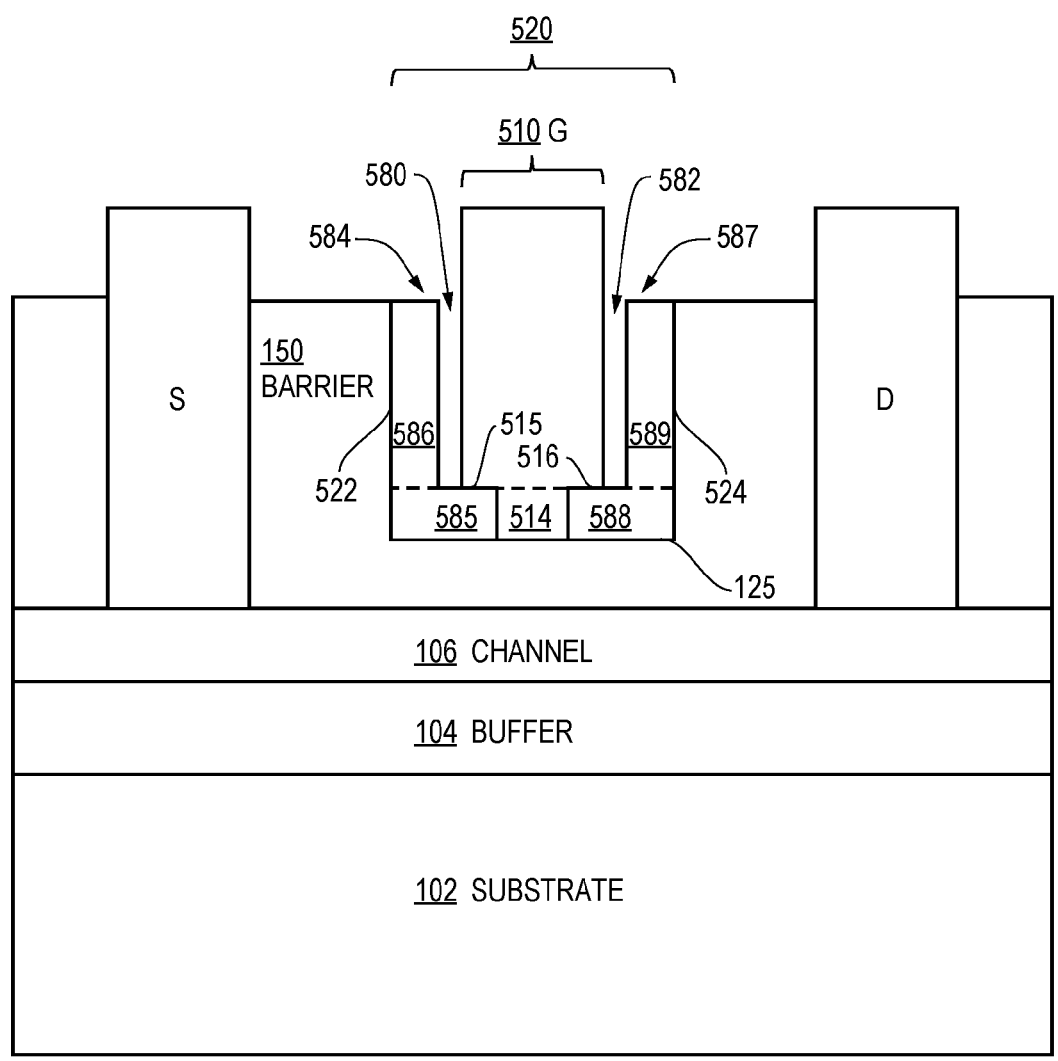
Figure 6:
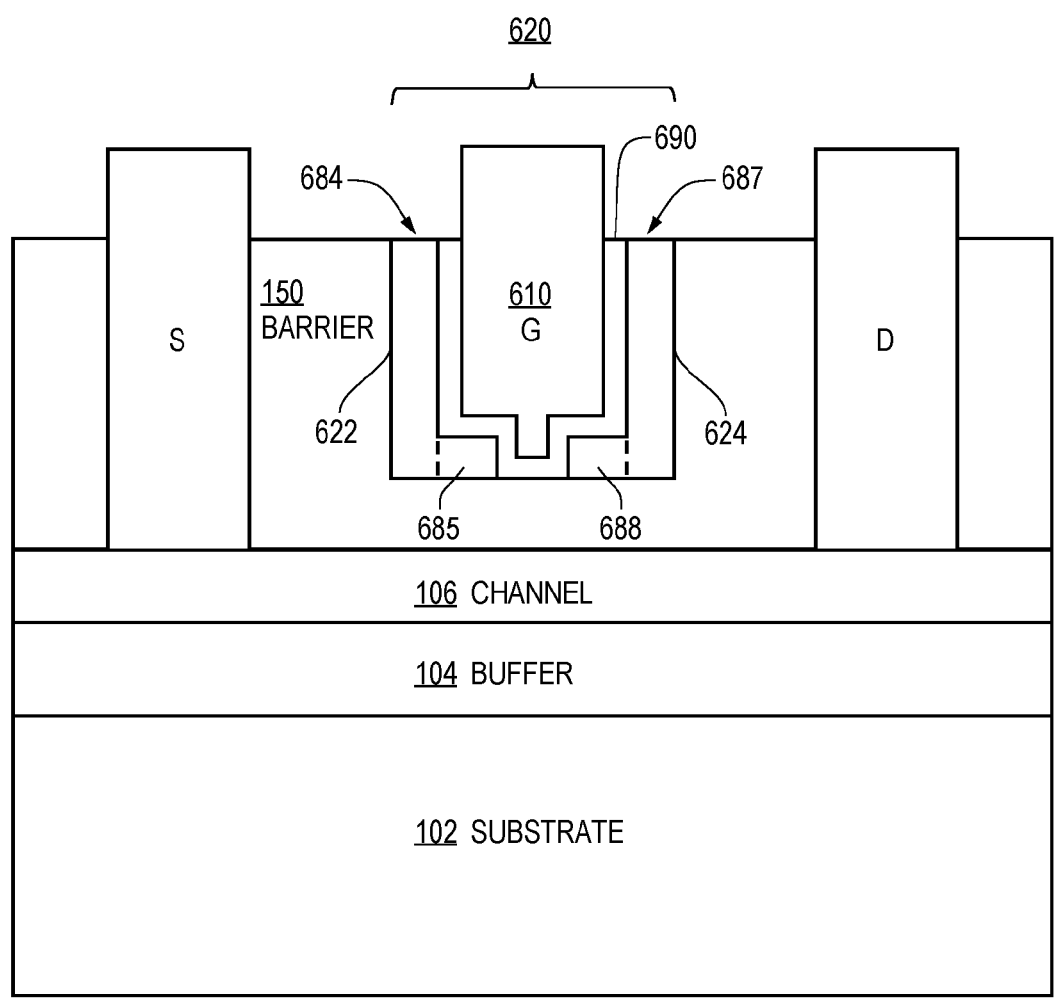

FIG. 4 shows a cross-section view of an exemplary semiconductor structure 400 containing a recessed-gate transistor with a gate contact 410 stepped on the bottom and insulated from sidewalls 422 and 424 of a gate recess 420 by filler elements 484 and 487, according to one embodiment of the present invention. Similarly, FIG. 5 shows an exemplary semiconductor structure 500 containing a recessed-gate transistor with a gate contact 510 stepped on the bottom and insulated from the sidewalls of the gate recess by air gaps 580, 582 as well as filler elements 584 and 587, according to another embodiment of the present invention. Furthermore, FIG. 6 shows an exemplary semiconductor structure 600 containing a recessed-gate transistor with a gate contact 610 stepped on the bottom and insulated from sidewalls 622 and 624 of gate recess 620 by filler elements 684, 687, and a gate dielectric layer 690, according to yet another embodiment of the present invention. Again, each of semiconductor structures 400, 500, and 600 may include a substrate 102, a buffer layer 104, a channel layer 106, and a barrier layer 150, comprising semiconductor materials as described with respect to FIGS. 1 to 3.

In semiconductor structure 400 shown in FIG. 4, gate recess 420 is etched into barrier layer 150, where a bottom 425 of gate recess 420 is within barrier layer 150. Gate contact 410 is disposed within gate recess 420, in-between source and drain ohmic contacts recessed into barrier layer 150. A lower portion of gate contact 410 is stepped to form a bottom stem 414 and two bottom steps 415 and 416 within gate recess 420. In other words, gate edge profiles of gate contact 410 is modified in FIG. 4 through the stepping process to increase an overall surface area around the bottom of the gate electrode. In some embodiments, multiple steps may be formed at the bottom of gate contact 420, on one side or on both sides, through the use of multiple filler elements formed using one or more selective etching steps. Furthermore, in some embodiments, gate contact 410 may be stepped to form a bottom stem and a single bottom step 416, on the side towards the drain ohmic contact, to reduce gate-drain leakage current. In FIG. 4, each of bottom step 415 and 416 is represented as a lower surface of the stepped portion of gate contact 410. Alternatively, a bottom step may be viewed as a cornered volume of the stepped portion of gate contact 410.

In addition, in this example, a non-stepped middle portion 413 of gate contact 410, located above bottom steps 415 and 416, is shown to have the same lateral length as top portion 412 of gate contact 410, where top portion 412 exceeds a top level of gate recess 420. In some embodiments, top portion 412 may be no greater in length than non-stepped middle portion 413. In some embodiments, top portion 412 may be no greater in length than gate recess 420. In yet some embodiments, top portion 412 may be wider in length than non-stepper middle portion 413, or gate recess 420, to form a T-shaped or Γ-shaped gate top, which may also be viewed as a gate electrode with one or more field plate extensions.

Furthermore, in this example, filler element 484 is of a L-shape, while filler element 487 is of a laterally-inverted L-shape. Filler element 484 covers bottom step 415 and the sidewall of gate contact 410 on the side of the source ohmic contact. Filler element 484 also covers or is in contact with sidewall 422 of gate recess 420 on the side of the source ohmic contact. Similarly, filler element 487 covers bottom step 416 and the sidewall of gate contact 410 on the side of the drain ohmic contact. Filler element 487 is further in contact with sidewall 424 of gate recess 420 on the side of the drain ohmic contact. Alternatively, in this embodiment, each of 484 and 487 may be viewed as a filler element group consisting of multiple filler elements or filler components. For example, group 484 may be viewed as a combination of a first filler element 485 disposed below bottom step 415, and a second filler element 486 disposed between gate contact 410 and sidewall 422. In addition, filler elements 485 and 486 are in contact with each other, and bottom step 415 is thus fully covered, or enclosed, by a combination of the first filler element 485 and the second filler element 486. Same applies to filler elements 488 and 489 that constitute group 487. In various embodiments, each constituting filler element such as 485, 486, 488, and 489 may comprise one or more insulating materials, possibly layered or stacked either laterally or vertically. If filler elements 485 and 486 comprise the same insulating material and are in contact with each other, then the combination of the two filler elements may be viewed as the L-shaped filler element 484. Moreover, in some other embodiments, filler elements 484 and 487 may raise above the top level of gate recess 420, and may further be extended laterally to fully or partially cover a top surface of barrier layer 150, or any other semiconductor layers placed thereon.

FIG. 5 shows another embodiment of the present invention, where air gaps 580 and 582 further insulate gate contact 510 from sidewalls 522 and 524 of gate recess 520 within barrier layer 150. In this example, L-shaped filler elements 584 and 587 may be viewed as combinations or groups of rectangular filler elements such as 585 and 586, and 588 and 589, respectively. Gate bottom steps 515 and 516, both formed at the bottom of gate contact 520, are in direct contact and covered by such filler elements.

FIG. 6 shows another embodiment of the present invention where a gate dielectric layer 690 is disposed within and over gate recess 620, directly above filler elements 685 and 688, and below gate contact 610 within the gate recess, thus insulating gate contact 610 from barrier layer 150. Dielectric layer 690 is also in contact with the vertical components of filler elements 684 and 687, thus enhancing the insulating effect of such filler elements. Gate dielectric layer 690 may be formed by oxidization of the surfaces of III-Nitride semiconductors inside the gate recess region, or by deposition of any suitable dielectric material, such as $SiO_2$, $Al_2O_3$, and SiN. In addition, although not shown explicitly, in some embodiments, gate dielectric layer 690 may be formed underneath the gate contact 610 only, where the sidewalls of gate contact 610 may be insulated by filler elements or air gaps from sidewalls of gate recess 620.

While FIGS. 1-6 provide exemplary embodiments of semiconductor structures comprising a barrier layer with or without sublayers, FIG. 7 shows an exemplary multi-layer semiconductor structure with a barrier layer 750 having a plurality of dual layer barrier structures, on which transistors with bottom steps may be formed, according to one embodiment of the present invention. In different embodiments, any suitable number of "dual-layer" barrier structures may be included. For example, as illustrated in FIG. 7, a semiconductor structure 700 may include a first dual-layer barrier structure 757 and a second dual-layer barrier structure 753, each having an upper barrier sublayer and a lower barrier sublayer. The upper and lower barrier sublayers are indicated in FIGS. 7 as 758 and 756, respectively, for dual-layer barrier structure 757, and indicated as 754 and 752, respectively, for dual-layer barrier structure 753. Dual-layer barrier structures 757 and 753 may have the same structure and/or composition, or a different structure and/or composition. In addition, barrier layer 750 may include one or both of a band-offset layer 730 and a carrier-donor layer 760. A passivation layer 770 may be further included in the semiconductor structure 700 above barrier layer 750. Each barrier sublayer may be formed using materials and processes similar for barrier sublayers as discusses with respect to semiconductor structures 100, 200 and 300 shown in FIGS. 1 to 3. For example, each layer or sublayer shown in FIG. 7 may comprise a III-N material $B_wAl_xIn_yGa_zN$. Moreover, a gate recess or an ohmic recess may be formed through one or more of the barrier sublayers 760, 758, 756, 754, 752, and 730, and a bottom surface of such gate or ohmic recesses may be positioned within or on any of the barrier sublayers.

In one illustrative embodiment where barrier layer 750 comprises dual-layer structures 757 and 753 only, to form a recess such as a gate recess, a first etching process (e.g., a dry etching process) may be performed to remove a region of layer 758, then a second etching process (e.g., a wet etching process) may be performed to remove a region of layer 756. Then, the first etching process (e.g., a dry etching process) may be performed to remove a region of layer 754, and the second etching process (e.g., a wet etching process) may be performed to remove a region of layer 752. A bottom-stepped gate contact may be formed in the gate recess by first depositing a filler layer covering the bottom the gate recess, then recessing through the filler layer, wherein a length of the second recess through the filler layer is shorter than that of the first recess, to form one or more filler elements at the bottom of the gate recess. Source and drain regions with or without ohmic recesses may be formed as well.

In embodiments where each or any combination of a band-offset layer 730, a carrier-donor layer 760, and a passivation layer 770 may be included in the semiconductor structure 700, similar etching techniques may be performed to form gate and/or ohmic recesses through the passivation layer, and one or more sublayers of barrier layer 750. The techniques described herein are not limited in this respect, as band-offset layer 730, carrier-donor layer 760, and passivation layer 770 may be optional.

Structures and techniques described herein are not limited to techniques for forming a gate-recess. Such techniques may be used any other application where a damage-free, uniform and/or reproducible etch is desired, or where bottom-stepped electrodes are needed. One example is the formation of ohmic recesses to reduce ohmic contact resistance and/or to form gold-free ohmic contacts. Another example is the formation of one or more recesses and/or electrodes to access an n-doped layer in a GaN light emitting diode or laser. A further example is the formation of one or more recesses and/or electrodes to access the base and/or collector layers in a III-N bipolar transistor.

FIG. 8 shows another multi-layer semiconductor structure 800 further extending the "dual layer" barrier structure 700 shown in FIG. 7, where barrier layer 880 comprises a spacer layer 832 and a cap layer 850 having multiple selectively etchable sublayers, according to one embodiment of the present invention. In different embodiments, both multi-layer semiconductor structure 700 and multi-layer semiconductor structure 800 may be used for fabricating transistors having different threshold voltages ($V_T$) and bottom-stepped gate contacts. The threshold voltage of a transistor is a gate voltage past which the transistor is turned from an on-state to an off-state, or vice versa. Semiconductor structure 800 may include a substrate layer 802, a buffer layer 804, a channel layer 806, a band-offset layer 830, a spacer layer 832, a cap layer 850, a carrier donor layer 860, and a passivation layer 870. Each of substrate layer 802, buffer layer 804, and channel layer 806 may be formed using materials and processes similar for substrate layer 102, buffer layer 104, and channel layer 106, respectively, according to descriptions of embodiments shown in FIGS. 1-6. Cap layer 850 may be formed using materials and processes similar for barrier sublayers 758, 756, 754, or 752 shown in FIG. 7, or similar for barrier sublayers as discusses with respect to semiconductor structures shown in FIGS. 1-6. Compared with previously disclosed semiconductor structures such as 100, 200, 400, or 700, each of semiconductor layers above channel layer 806, including band-offset layer 830, spacer layer 832, sublayers of cap layer 850, and carrier-donor layer 860, may be viewed as a sublayer within general barrier layer 880. Each or any barrier sublayer as disclosed herein may be optional.

Instead of pairs of upper and lower barrier layers, cap layer 850 comprises a plurality of n selectively etchable sublayers, such as sublayer 851 with thickness $t_1$, sublayer 852 with thickness $t_2$, sublayer 858 with thickness $t_{n-1}$, and sublayer 859 with thickness $t_n$, where n may be any even or odd integer greater than or equal to two, according to various embodiments of the present invention. For example, a multi-layer barrier 880 with a cap layer 850 having n=4 sublayers, a band-offset layer, and a carrier-donor layer, gives rise to the illustrative semiconductor structure 700 shown in FIG. 7. Thickness $t_1, t_2, \ldots, t_n$ may be between 2 angstroms and 500 nanometers, and may or may not be the same in various embodiments of the present invention. For example, $t_n$ may be greater than or equal to the total thickness of all other sublayers. In another example, all odd-numbered or odd sublayers may be grown to a first thickness, while all even-numbered or even sublayers may be grown to a second thickness.

In some embodiments, each i-th sublayer ($1 \leq i < n$) of cap layer 850 is selectively etchable with respect to the (i+1)-th sublayer below using some etching technique, thus the (i+1)-th sublayer below may serve as an etch stop for the i-th sublayer under the given etching technique. The n-th sublayer may further be selectively etchable with respect to band-offset layer 830, spacer layer 832, or any layer disposed directly below and/or in contact with the n-th sublayer. Spacer layer 832 may or may not be selectively etchable over band-offset layer 830. In some embodiments, each sublayer is selectively etchable with respect to both the sublayer above and the sublayer below using some etching technique, such as dry etching, wet etching, or a combination of dry etching and wet etching. For example, selectively etchable sublayers may be classified into two types. All odd sublayers counting from the first sublayer 851 may be formed of a material that is selectively etchable with respect to even sublayers by a first etching technique, such as dry etching, while all even sublayers counting from the second sublayer 852 may be formed of a material that is selectively etchable with respect to odd sublayers by a second etching technique, such as wet etching, or vice versa. The n-th sublayer may further be selectively etchable with respect to band-offset layer 830, spacer layer 832, or any layer disposed directly below and/or in contact with the n-th sublayer, using a dry etch process, a wet etch process or a combination thereof. The n-th sublayer may be etched at a faster rate the layer below, and the selectivity of the etch process may be greater than 3:1, such that the n-th sublayer is etched at a rate greater than three times as high as the rate at which layer below is etched. Spacer layer 832 may or may not be selectively etchable over sublayer 859 and/or band-offset layer 830. Band-offset layer 830 may or may not be selectively etchable over sublayer 859 and/or spacer layer 832. Each of the odd sublayers may have the same structure, composition, and/or thickness. Alternatively, each of the odd sublayers may have a different structure, composition, and/or thickness. Similarly, each of the even sublayers may have the same structure, composition, and/or thickness, or a different structure, composition, and/or thickness. In yet some other embodiments, each sublayer may be selectively etchable with respect to a selected subset of all other sublayers, using one or more etching techniques. For example, in some embodiments, selectively etchable sublayers may be classified into three types, where each type is repeated every three sublayers, and where each type is selectively etchable over the other two types using one or more etching techniques.

More specifically, selective etchability of sublayers within cap layer 850 may be achieved by alternating sublayer material between two or more types of compositions. In some embodiments, all odd sublayers counting from the first sublayer 851 may include or comprise a semiconductor material that is selectively etchable in a dry etching process, such as GaN, or another nitride semiconductor material $B_wAl_xIn_yGa_zN$, in which w, x, y and z each has a suitable value between zero and one inclusive ($0 \leq w, x, y, z \leq 1$), and the composition is such that the nitride semiconductor material is selectively etchable using a dry etching process. In one example, odd sublayers may be formed of a semiconductor material $B_wAl_xIn_yGa_zN$ where x is less than 0.25. In different embodiments, the values of w, x, y, and z may or may not add to 1. In some embodiments, odd sublayers may be formed of a semiconductor material $Al_xIn_yGa_zN$ in which x, y, and z each has a suitable value between zero and one inclusive ($0 \leq x, y, z \leq 1$), and where the values of x, y, and z may or may not add to 1. Similarly, all even sublayers counting from the second sublayer 852 may include or comprise a semiconductor material that is selectively etchable in a wet etching process, such as AlN, or another nitride semiconductor material $B_wAl_xIn_yGa_zN$, in which w, x, y and z each has a suitable value between zero and one inclusive ($0 \leq w, x, y, z \leq 1$), and the composition is such that the nitride semiconductor material is selectively etchable using a wet etching process. The values of w, x, y, and z may or may not add to 1. In one example, even sublayers may be formed of a semiconductor material $B_wAl_xIn_yGa_zN$ where x is greater than 0.5. In some embodiments, even sublayers may be formed of a semiconductor material $Al_xIn_yGa_zN$ in which x, y, and z each has a suitable value between zero and one inclusive ($0 \leq x, y, z \leq 1$), and where the values of x, y, and z may or may not add to 1. In those embodiments, at least one of the selectively etchable sublayers may have a non-zero Ga content ($0 < z \leq 1$) that makes the layer growth process easier. When consecutive, adjacent or continuous sublayers of cap layer 850 have their material compositions alternate between GaN and AlN, fluorine-based chemicals may be used to dry etch GaN without etching AlN, while tetramethylammonium hydroxide (TMAH) may be used to wet etch AlN without etching GaN. In some embodiments, odd layers may include or comprise a semiconductor material that is selectively etchable in a wet etching process, such as AlN, while even layers may include or comprise a semiconductor material that is selectively etchable in a dry etching process, such as GaN.

The reference herein to $B_wAl_xIn_yGa_zN$, "$B_wAl_xIn_yGa_zN$ material," or "III-N material" refers to a semiconductor material having nitride and one or more of boron, aluminum, indium and gallium. An $Al_xIn_yGa_zN$ material is a $B_wAl_xIn_yGa_zN$ material where w=0. Examples of $B_wAl_xIn_yGa_zN$ materials include, but are not limited to, GaN, AlN, AlGaN, AlInGaN, InGaN, and BAlInGaN, $Al_{0.15}Ga_{0.85}N$, and $Al_{0.65}Ga_{0.35}N$, by way of illustration. A $B_wAl_xIn_yGa_zN$ material may include other materials besides nitride, boron, aluminum, indium and/or gallium. For example, a $B_wAl_xIn_yGa_zN$ material may be doped with a suitable dopant such as silicon or germanium.

In some embodiments, selective etchability of sublayers within cap layer 850 is achieved by alternating aluminum content or composition of adjacent or consecutive sublayers between a relatively high value or percentage and a relatively low value or percentage. In other words, selective etchability may be achieved by alternating between Al-light and Al-rich sublayers, or adjusting the value of x for material $B_wAl_xIn_yGa_zN$ or $Al_xIn_yGa_zN$ as described above. In one example, consecutive or adjacent sublayers of cap layer 850 may have Al contents alternating between less than 0.5 inclusive and greater than 0.5 exclusive, less than 0.5 exclusive and greater than 0.5 inclusive, or less than 0.5 exclusive and greater than 0.5 exclusive. In other examples, consecutive or adjacent sublayers of cap layer 850 may have Al content alternate between less than 0.25 and greater than 0.5, less than 0.35 and greater than 0.5, or less than 0.35 and greater than 0.65, inclusive or exclusive. In some embodiments, at least one of the plurality of selectively etchable sublayers has an Al content great than 0.5. In addition, at least one of the selectively etchable sublayers may have a non-zero Ga content ($0 < z \leq 1$). Moreover, B, Al, In, and Ga compositions in each type of sublayers may not necessarily be the same. For example, when n is odd, first sublayer 851 and n-th sublayer 859 may have x=0.1 and x=0.2 respectively, while second layer 852 and (n−1)-th sublayer 858 may have x=0.6 and x=0.7 respectively. Similarly, when n is even, first sublayer 851 and (n−1)-th sublayer 858 may have x=0.1 and x=0.2 respectively, while second sublayer 852 and n-th sublayer 859 may have x=0.6 and x=0.7 respectively.

In some embodiments, each layer or sublayer of multi-layer semiconductor structure 800 may comprise a III-N material $B_wAl_xIn_yGa_zN$, and optional spacer layer 832 may comprise a III-N material with a zero Al content in the form of $B_wIn_yGa_zN$, including materials such as GaN and InGaN. Spacer layer 832, or any other sublayer of barrier 880 may also be n-type doped.

In some embodiments, one or more layers or sublayers shown in FIG. 8 may comprise III-N materials such as GaN, AlN, AlGaN, InAlN, and AlInGaN. For example, channel layer 806 may comprise GaN, band-offset layer 830 may comprise AlGaN, spacer layer 832 may comprise GaN, and cap layer 850 may comprise alternating layers of GaN and AlN. In some embodiments, band-offset layer 830 may comprise a III-N material with a non-zero Al content. In some embodiments, band-offset layer 830 may comprise a III-N material $Al_xIn_yGa_zN$ in which x+y+z=1, $0 < x \leq 1$, $0 \leq y \leq 1$, and $0 \leq z \leq 1$. In yet some embodiments, band-offset layer 830 may comprise a III-N material $Al_xGa_zN$ in which x+z=1, $0.05 < x \leq 0.4$, and $0.6 \leq z < 0.95$.

In some embodiments, band-offset layer 830 may have a wider bandgap or a higher conduction band edge than channel layer 806 below and spacer layer 832 above. In addition, spacer layer 832 may have a narrower bandgap or a lower conduction band edge than sublayer 859 immediately above. A spacer layer with a narrower bandgap makes the net polarization charge at the interface between the spacer layer and the band-offset layer negative as the polarization of the spacer layer is smaller than that of the band-offset layer, thus helping to improve the threshold voltages when the multi-layer structure 800 with spacer layer 832 is used in a field-effect transistor.

In yet some embodiments, barrier layer 880 may comprise a bottom sublayer, a middle sublayer, and a top sublayer, where the bottom sublayer may have an equal or wider bandgap than channel layer 806 below, the middle sublayer may have an equal or wider bandgap than the bottom sublayer, while the top sublayer may have an equal or narrower bandgap than the middle sublayer. For example, such bottom, middle and top sublayers may correspond to band-offset layer 830, spacer layer 832, and sublayer 859 shown in FIG. 8, respectively. In some embodiments, the bottom sublayer comprises $Al_{x1}Ga_{z1}N$, the middle sublayer comprises AlN, and the top sublayer comprises $Al_{x2}Ga_{z2}N$. The middle sublayer may serve as an etch stop for the top sublayer.

Furthermore, optional spacer layer 832 shown in FIG. 800 may have a thickness less than or equal to 20 nm, and/or greater than or equal to 0.2 nm. In various embodiments, thickness of a layer or sublayer may refer to an average, maximum, or medium vertical distance measured between points on an upper interface and a lower interface of the layer or sublayer.

Additionally, a back barrier layer 805 may be inserted between channel layer 806 and buffer layer 830 in some embodiments, where the added back barrier layer may comprise a III-N material $Al_xIn_yGa_zN$ in which $0 \leq x \leq 1$, $0 \leq y \leq 1$, and $0 \leq z \leq 1$, such as InN, AlN, InGaN, AlGaN, InAlN, and InAlGaN. The thickness of back barrier layer 805 may be between 1 nm and 5 µm, but less than a critical thickness before which back barrier layer 805 may crack due to mechanical stress. Back barrier layer 805 may have a wider bandgap than channel layer 806, a stronger polarization in the c-axis, or a negative polarization in the c-axis than that of the channel layer, so electrons in the channel layer may be better confined.

FIGS. 9, 10, 11, and 12 show non-limiting exemplary multi-layer semiconductor structures 900, 1000, 1100 and 1200, each containing a recessed-gate transistor with a gate contact stepped on the bottom and insulated from the sidewalls of the gate recess by filler elements, using structure 700 shown in FIG. 7, or structure 800 shown in FIG. 8, according to different embodiments of the present invention, respectively. In these exemplary structures, any of a bottom surface of the gate recess, a bottom surface of each filler element, or a bottom surface of a bottom stem of the stepped gate may be positioned within or on a sublayer in the multi-layer semiconductor structure disclosed herein, including, but are not limited to, a channel layer, or any sublayer of a barrier layer, where the barrier layer may comprise any combination of a band-offset layer, a spacer layer, a cap layer with selectively etchable sublayers, a carrier-donor layer, and any other suitable semiconductor layers. In other words, FIGS. 9, 10, 11, and 12 provide illustrative examples of relative positions of filler elements, gate recess, and gate bottom steps within the gate recess, in different permutations or variations.

Figure 9:
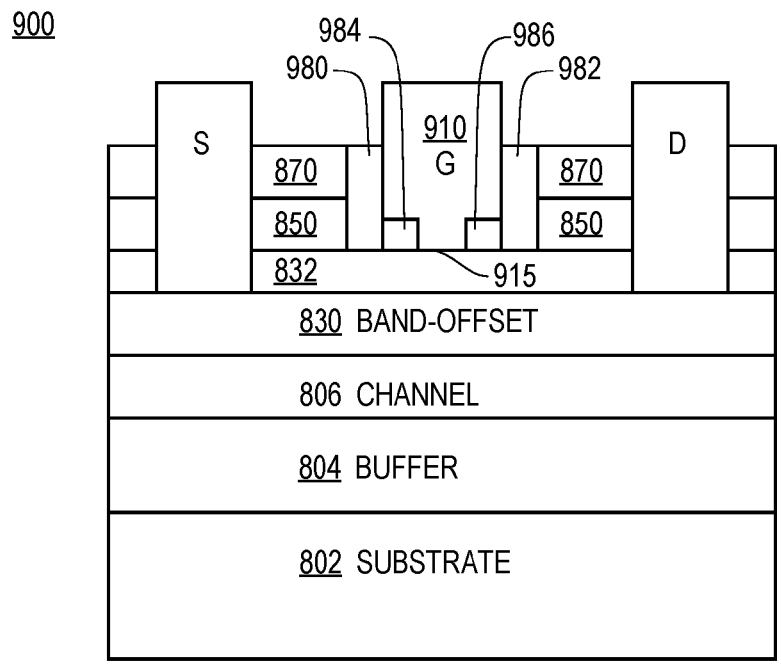
FIGS. 9, 10, 11, and 12 show exemplary multi-layer semiconductor structures each containing a recessed-gate transistor with a gate electrode stepped on the bottom, according to several embodiments of the present invention, respectively.
Figure 10:
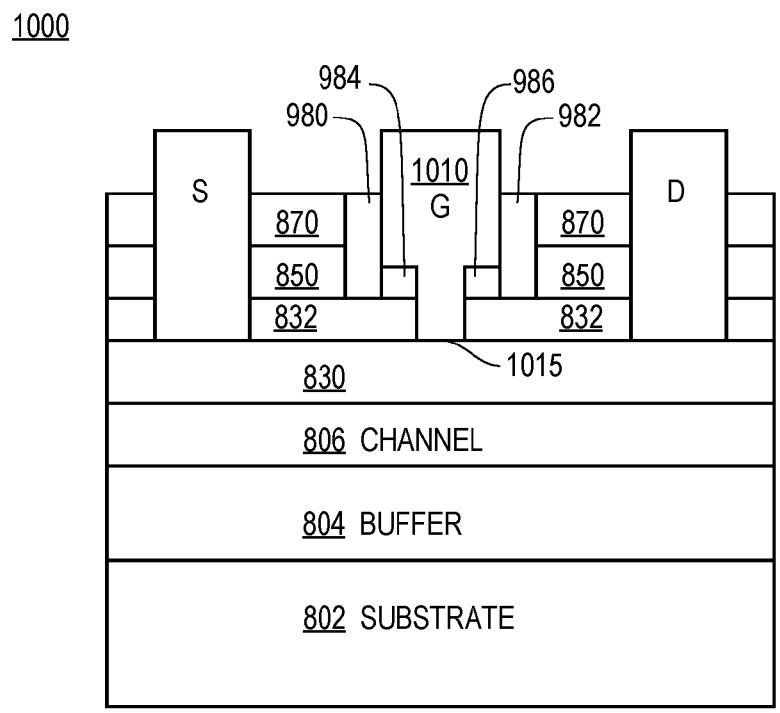

More specifically, FIGS. 9 and 10 show two exemplary multi-layer semiconductor structures 900 and 1000 each containing a recessed-gate transistor with a gate contact stepped on the bottom and insulated from the sidewalls of the gate recess by filler elements 980, 982, 984, and 986, using structure 800 shown in FIG. 8, but without an explicit carrier-donor layer such as layer 860, according to two separate embodiments of the present invention. Similar to the transistor structure shown in FIG. 4, both gate electrodes 910 and 1010 are stepped at the bottom within gate recesses, respectively. Each of filler elements 980, 982, 984, and 986 is positioned above and in contact with spacer layer 832. In addition, a bottom surface 915 of gate contact 910 shown in FIG. 9 is positioned on spacer layer 832. By comparison, a bottom surface 1015 of gate contact 1010 shown in FIG. 10 is positioned on band-offset layer 830. In both cases, the bottom surface of the gate contact may be viewed as the bottom surface of the gate recess as well. In various embodiments, a bottom of the gate contact or the gate recess may be positioned anywhere within or on a sublayer in the multi-layer semiconductors structures disclosed herein, including, but are not limited to, a channel layer, or any sublayer of a barrier layer, where the barrier layer may comprise any combination of a band-offset layer, a spacer layer, a cap layer with selectively etchable sublayers, a carrier-donor layer, or any other suitable semiconductor layers. In addition, each of filler elements 980 and 982, which are in direct contact with passivation layer 870, may comprise the same insulating material as passivation layer 870. Each of filler elements 980 and 982 may not be limited to within the gate recess either. They may extend beyond the gate recess, to be placed over passivation layer 870, for example, using conformal deposition techniques.

Figure 11:
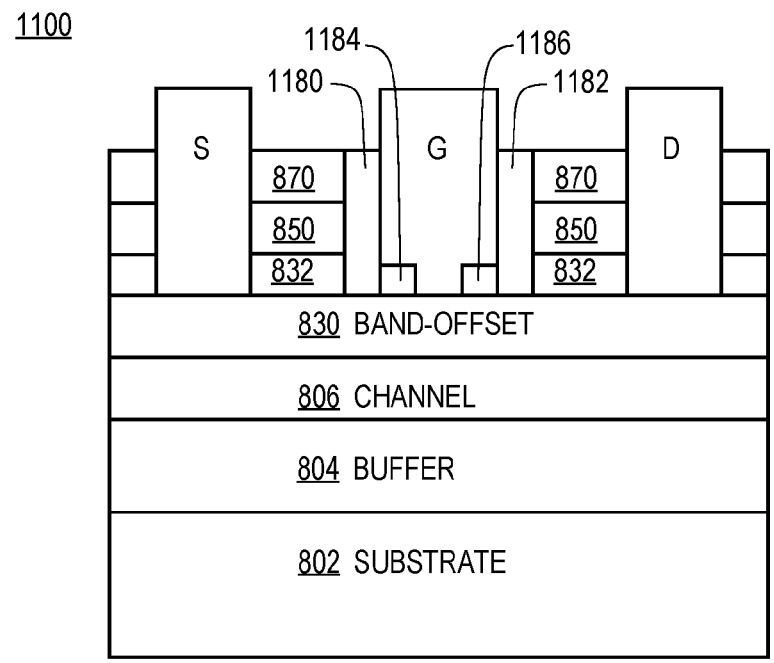
Figure 12:
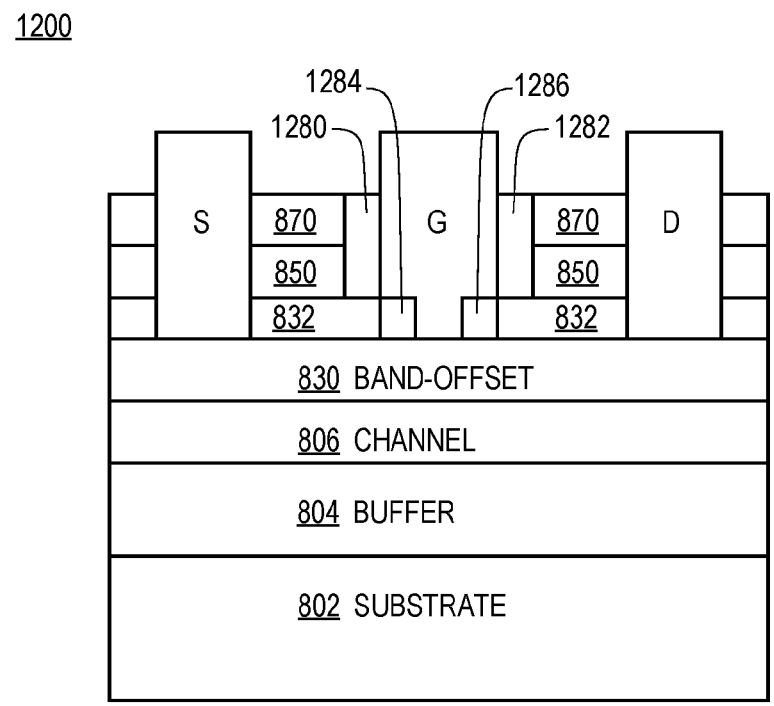

By comparison, in FIG. 11, each of filler elements 1180, 1182, 1184, and 1186 are positioned on band-offset layer 830, while a bottom surface of the gate contact is also positioned on band-offset layer 830. In FIG. 12, filler elements 1280 and 1282 are positioned on spacer layer 832, filler elements 1284 and 1286 are positioned on band-offset layer 830, and a bottom surface of the gate contact is also positioned on band-offset layer 830. Each of the filler elements as shown in FIGS. 9 to 11 may comprise the same of different insulating materials.

To fabricate recessed-gate transistors with bottom-stepped gate contacts as shown in FIGS. 9 to 12, epitaxial growth of multiple semiconductor layers and selective etching of sublayers maybe performed. As an example, a fabrication process is discussed below.

To form semiconductor structure 900 shown in FIG. 9, epitaxial growth of buffer layer 804 may first take place on substrate layer 802. Subsequently, layers 806, 830, 832, and 850 may be grown successively over buffer layer 804, and passivation layer 870 may be formed thereon. A photoresist mask may then be used to pattern for gate and ohmic recesses, where either wet etching or dry plasma etching may be formed to remove passivation layer 870. The etching of layer 870 may be stopped on the surface of barrier layer 850. For example, $SF_6$-based plasma can selectively etch passivation layer 870 over III-Nitride semiconductor barrier layer 850.

Depending on the desired recess depth and the number of sublayers within, barrier layer 850 may be further etched in the gate recess region, using one or more selective-etching techniques. Moreover, in some embodiments, a bottom sublayer of barrier layer 850 may be selectively etchable over spacer layer 832. For example, dry plasma containing $BCl_3$ and $SF_6$ gases may be used to selectively etch a bottom sublayer of barrier layer 850 containing less Al content than spacer layer 832, where spacer layer 832 may serve as an etch stop. To form semiconductor structure 1000 shown in FIG. 10, spacer layer 832 may be further etched. In some embodiments, spacer layer 832 may be selectively etchable over band-offset layer 830. For example, spacer 832 may have higher Al content than band-offset layer 830, and may be wet etched using tetramethylammonium hydroxide or potassium hydroxide at elevated temperature, where the etch stops on band-offset layer 830. Similarly, time-etching or digital etching techniques may be employed to achieve desired recess depths.

In some exemplary embodiments, a conformal deposition of a filler layer covering the sidewalls of the gate recess may be performed, with non-isotropic plasma etching of the filler layer and selectivity over spacer layer 832 to form filler elements 980 and 982. Another filler layer covering the bottom of the gate recess may be deposited, followed by wet etching or dry plasma etching through the center to form a shorter recess with a bottom surface 915, and filler elements 984 and 986. If all four filler elements 980, 982, 984, and 986 comprise the same material, a single deposition step may be used instead of two. In embodiments where passivation layer 870 comprises the same material as the filler elements, the same deposition step may be used, followed by a subsequent recess step through the insulating material, to form passivation layer 870, filler elements 980 and 982, and filler elements 984 and 986. Additionally, recessing and deposition steps may be re-ordered as necessary, to form other filler element configurations such as shown in FIG. 12.

A gate electrode as shown in FIG. 9 may be deposited in the gate region covering the gate recess after the formation of the filler elements, with or without additional air gaps. Moreover, additional dielectric and metal layers may be formed over the device shown in FIG. 9 using standard back-end processes.

Ohmic recesses as shown in FIG. 9 may have the same or different depth as the game recess. More specifically, ohmic recesses may be etched through at least the passivation layer 870. In different embodiments, ohmic recesses may be formed before, after, or at the same time as the gate recess.

Ohmic contacts or electrodes may be formed by depositing metals such as titanium and aluminum in the ohmic regions, covering the ohmic recesses, and by annealing the ohmic metal between 400° C. and 1000° C. Alternatively, ohmic contacts may be formed by implantation of n-type dopants such as Si, Ge or other suitable n-type dopants in the ohmic regions and subsequent activation of the dopants by annealing between 900° C. and 1400° C. After ohmic implantation and activation, ohmic metal may be deposited covering at least a part of the implantation region with optional ohmic metal annealing to form the ohmic contacts.

Additional Aspects

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items. For example, an apparatus, structure, device, layer, or region recited as "including," "comprising," or "having," "containing," "involving," a particular material is meant to encompass at least the material listed and any other elements or materials that may be present. The partially open-ended phrase "consisting essentially of" is meant to encompass essentially the material listed and does not preclude the presence of relatively small quantities of other materials, including the presence of dopants.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments. In other words, although the present invention has been described with reference to specific exemplary embodiments, it will be evident that the various modification and changes can be made to these embodiments without departing from the broader scope of the invention. Accordingly, the specification and drawings are to be regarded in an illustrative sense rather than in a restrictive sense. It will also be apparent to the skilled artisan that the embodiments described above are specific examples of a single broader invention which may have greater scope than any of the singular descriptions taught. There may be many alterations made in the descriptions without departing from the scope of the present invention.

What is claimed is:

1. A method of fabricating a multi-layer semiconductor structure for use in a III-Nitride (III-N) semiconductor device, comprising:
    forming a channel layer comprising a first III-N material for providing electrical conduction;
    forming a barrier layer comprising a second III-N material above the channel layer,
        wherein the barrier layer comprises a band-offset layer, wherein the band-offset layer comprises a third III-N material, and wherein the band-offset layer has a wider bandgap than the channel layer;
    forming a pair of ohmic recesses by patterning and etching of the barrier layer;
    depositing a pair of ohmic electrodes in the pair of ohmic recesses respectively;
    forming a gate recess by patterning and etching of the barrier layer, wherein the gate recess is positioned in-between the pair of ohmic recesses;
    depositing a first filler layer covering a bottom of the gate recess, wherein the first filler layer comprises a first insulating material;
    recessing a recess through the first filler layer, wherein a length of the recess through the first filler layer is smaller than that of the gate recess, to form a first filler element at a bottom of the gate recess; and
    depositing a gate electrode in the gate recess, wherein the gate electrode is stepped by the first filler element to form a bottom stem and a bottom step within the gate recess.

2. The method of claim 1, further comprising:
    depositing a second filler element between the gate electrode and a sidewall of the gate recess,
    wherein the second filler element comprises a second insulating material,
    wherein the second filler element covers at least a portion of the sidewall of the gate recess, and
    wherein the second filler element is in contact with the first filler element.

3. The method of claim 2, wherein a sidewall of the gate electrode is insulated by an air gap between the sidewall of the gate electrode and the second filler element.

4. The method of claim 1, wherein a portion of the gate electrode exceeding a top level of the gate recess is no greater in length than the gate recess.

5. The method of claim 1, further comprising:
    depositing a gate dielectric layer over the gate recess, above the first filler element and below the gate electrode within the gate recess.

6. The method of claim 1, wherein the barrier layer is formed by:
    depositing a spacer layer comprising a fourth III-N material; and
    depositing a cap layer on the spacer layer, the cap layer comprising at least two sublayers,
        wherein each sublayer is selectively etchable with respect to sublayers immediately below and above,
        wherein each sublayer comprises a III-N material $Al_xIn_yGa_zN$ in which $0 \leq x \leq 1$, $0 \leq y \leq 1$, and $0 \leq z \leq 1$,
        wherein at least one of the sublayers has a non-zero Ga content with $0 < z \leq 1$,
        wherein a sublayer immediately above the spacer layer has a wider bandgap than the spacer layer, and
        wherein a bottom of the gate recess is within or on a layer selected from the group consisting of the channel layer, the spacer layer, and one of the sublayers of the cap layer.

7. The method of claim 1, wherein the barrier layer is formed by:
    depositing a bottom sublayer on the channel layer;
    depositing a middle sublayer on the bottom sublayer; and
    depositing a top sublayer on the middle sublayer,
        wherein each sublayer comprises a III-N material $Al_xIn_yGa_zN$ in which $0 \leq x \leq 1$, $0 \leq y \leq 1$, and $0 \leq z \leq 1$, wherein the bottom sublayer has a bandgap equal to or greater than that of the channel layer, wherein the middle sublayer has a bandgap equal to or greater than that of the bottom sublayer, wherein the top sublayer has a bandgap equal to or smaller than that of the middle sublayer, and wherein a bottom of the gate recess is within or on a layer selected from the group consisting of the channel layer, and one of the sublayers of the barrier layer.

8. The method of claim 1, further comprising:

depositing a back barrier layer below the channel layer, wherein the back barrier layer comprises a III-N material $Al_xIn_yGa_zN$ in which $0 \leq x \leq 1$, $0 \leq y \leq 1$, and $0 \leq z \leq 1$, and wherein the back barrier layer has a wider bandgap and/or an opposite polarization direction than the channel layer.

9. A multi-layer semiconductor structure for use in a III-Nitride (III-N) semiconductor device, comprising:

a channel layer comprising a first III-N material for providing electrical conduction;

a barrier layer disposed above the channel layer, wherein the barrier layer comprises a second III-N material, wherein the barrier layer comprises a band-offset layer, wherein the band-offset layer comprises a third III-N material, and wherein the band-offset layer has a wider bandgap than the channel layer;

a back barrier layer disposed below the channel layer, wherein the back barrier layer comprises a III-N material $Al_xIn_yGa_zN$ in which $0 \leq x \leq 1$, $0 \leq y \leq 1$, and $0 \leq z \leq 1$, and wherein the back barrier layer has a wider bandgap and/or an opposite polarization direction than the channel layer;

a pair of ohmic electrodes disposed in ohmic recesses etched into the barrier layer;

a gate recess etched into the barrier layer, in-between the pair of ohmic electrodes;

a gate electrode disposed in the gate recess, wherein the gate electrode is stepped to form a bottom stem and a bottom step within the gate recess; and a first filler element disposed at least below the bottom step of the gate electrode within the gate recess, the first filler element comprising a first insulating material.

10. The multi-layer semiconductor structure of claim 9, wherein a top portion of the gate electrode exceeding a top level of the gate recess is no greater in length than the gate recess.

11. The multi-layer semiconductor structure of claim 9, further comprising:

a gate dielectric layer disposed over the gate recess, above the first filler element and below the gate electrode within the gate recess.

12. The multi-layer semiconductor structure of claim 9, further comprising:

a passivation layer disposed on the barrier layer, wherein the gate recess is etched through the passivation layer.

13. The multi-layer semiconductor structure of claim 9, wherein the barrier layer comprises:

a spacer layer comprising a fourth III-N material; and a cap layer disposed on the spacer layer, the cap layer comprising at least two sublayers, wherein each sublayer is selectively etchable with respect to sublayers immediately below and above, wherein each sublayer comprises a III-N material $Al_xIn_yGa_zN$ in which $0 \leq x \leq 1$, $0 \leq y \leq 1$, and $0 \leq z \leq 1$, wherein at least one of the sublayers has a non-zero Ga content with $0 < z \leq 1$, wherein a sublayer immediately above the spacer layer has a wider bandgap than the spacer layer, and wherein a bottom of the gate recess is within or on a layer selected from the group consisting of the channel layer, the spacer layer, and one of the sublayers of the cap layer.

14. The multi-layer semiconductor structure of claim 9, wherein the barrier layer comprises a sublayer that is n-type doped.

15. The multi-layer semiconductor structure of claim 9, further comprising:

a second filler element disposed between the gate electrode and a sidewall of the gate recess, wherein the second filler element comprises a second insulating material, wherein the second filler element covers at least a portion of the sidewall of the gate recess, and wherein the second filler element is in contact with the first filler element.

16. The multi-layer semiconductor structure of claim 15, further comprising:

an air gap between a sidewall of the gate electrode and the second filler element.

17. A multi-layer semiconductor structure for use in a III-Nitride (III-N) semiconductor device, comprising:

a channel layer comprising a first III-N material for providing electrical conduction;

a barrier layer comprising a second III-N material, wherein the barrier layer comprises a bottom sublayer, a middle sublayer, and a top sublayer, wherein the bottom sublayer, the middle sublayer, and the top sublayer each comprises a III-N material $Al_xIn_yGa_zN$ in which $0 \leq x \leq 1$, $0 \leq y \leq 1$, and $0 \leq z \leq 1$, wherein the bottom sublayer has a bandgap equal to or greater than that of the channel layer, wherein the middle sublayer has a bandgap equal to or greater than that of the bottom sublayer, and wherein the top sublayer has a bandgap equal to or smaller than that of the middle sublayer, a pair of ohmic electrodes disposed in ohmic recesses etched into the barrier layer;

a gate recess etched into the barrier layer, in-between the pair of ohmic electrodes, wherein a bottom of the gate recess is within or on a layer selected from the group consisting of the channel layer, the bottom sublayer, the middle sublayer, and the top sublayer of the barrier layer;

a gate electrode disposed in the gate recess, wherein the gate electrode is stepped to form a bottom stem and a bottom step within the gate recess; and a first filler element disposed at least below the bottom step of the gate electrode within the gate recess, the first filler element comprising a first insulating material.

18. The multi-layer semiconductor structure of claim 17, wherein a top portion of the gate electrode exceeding a top level of the gate recess is no greater in length than the gate recess.

19. The multi-layer semiconductor structure of claim 17, further comprising:

a second filler element disposed between the gate electrode and a sidewall of the gate recess, wherein the second filler element comprises a second insulating material, wherein the second filler element covers at least a portion of the sidewall of the gate recess, and wherein the second filler element is in contact with the first filler element.

20. The multi-layer semiconductor structure of claim 19, further comprising:
   an air gap between a sidewall of the gate electrode and the second filler element.

* * * * *